United States Patent
Chang et al.

(10) Patent No.: US 9,906,209 B2
(45) Date of Patent: Feb. 27, 2018

(54) BIASED IMPEDANCE CIRCUIT, IMPEDANCE ADJUSTMENT CIRCUIT, AND ASSOCIATED SIGNAL GENERATOR

(71) Applicant: MEDIATEK Inc., Hsin-Chu (TW)

(72) Inventors: Keng-Meng Chang, Hsinchu (TW); Yao-Chi Wang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/498,525

(22) Filed: Apr. 27, 2017

(65) Prior Publication Data

US 2017/0346464 A1 Nov. 30, 2017

Related U.S. Application Data

(60) Provisional application No. 62/342,220, filed on May 27, 2016.

(51) Int. Cl.
*H03K 19/003* (2006.01)
*H04B 1/00* (2006.01)
(Continued)

(52) U.S. Cl.
CPC .......... *H03H 11/30* (2013.01); *H03K 5/159* (2013.01); *H03K 19/0005* (2013.01);
(Continued)

(58) Field of Classification Search
CPC .......... H03K 19/173; H03K 19/0005; H03K 17/04206; H03K 17/0822; H03K 17/6872;
(Continued)

(56) References Cited

U.S. PATENT DOCUMENTS 6,794,935 B2 * 9/2004 Klomsdorf ............ H03F 1/0261
330/129
6,909,204 B2 * 6/2005 Batey ........................ G05F 1/40
307/130
(Continued)

OTHER PUBLICATIONS

Chandrakumar, et al.: "A 2μW 40mVpp Linear-Input-Range Chopper-Stabilized Bio-Signal Amplifier with Boosted Input Impedance of 300MΩ and Electrode-Offset Filtering"; ISSCC 2016 / Session 5 / Analog Techniques / 5.5; pp. 96-98.

*Primary Examiner* — Vibol Tan
(74) *Attorney, Agent, or Firm* — McClure, Qualey & Rodack, LLP

(57) ABSTRACT

A biased impedance circuit, an impedance adjustment circuit, and an associated signal generator are provided. The biased impedance circuit is coupled to a summation node and applies a biased impedance to the summation node. A periodic input signal is received at the summation node. The biased impedance circuit includes a switching circuit for receiving an output window signal, wherein a period of the output window signal is shorter than a period of the periodic input signal. The switching circuit includes a low impedance path and a high impedance path. The low impedance sets the biased impedance to a first impedance when the output window signal is at a first voltage level. The high impedance path sets the biased impedance to a second impedance when the output window signal is at a second voltage level. The first impedance is less than the second impedance.

20 Claims, 17 Drawing Sheets

(51) Int. Cl.
*H03L 7/00* (2006.01)
*H03H 11/30* (2006.01)
*H03K 5/159* (2006.01)
*H03K 19/0175* (2006.01)
*H03K 19/00* (2006.01)
*H04B 1/04* (2006.01)
*H04B 1/16* (2006.01)
*H04L 25/02* (2006.01)
*H03L 1/02* (2006.01)
*H03L 7/18* (2006.01)
*H03L 7/10* (2006.01)
*H03L 7/113* (2006.01)
*H03K 19/21* (2006.01)

(52) U.S. Cl.
CPC ..... *H03K 19/017545* (2013.01); *H03L 1/022* (2013.01); *H03L 7/103* (2013.01); *H03L 7/113* (2013.01); *H03L 7/18* (2013.01); *H04B 1/0475* (2013.01); *H04B 1/1638* (2013.01); *H04L 25/028* (2013.01); *H04L 25/0278* (2013.01); *H04L 25/0292* (2013.01); *H03K 19/21* (2013.01)

(58) Field of Classification Search
CPC .......... H03K 19/017545; H04B 1/0458; H04B 1/40; H04B 1/48; H04B 5/0037; H04B 5/0062; H04L 25/0278; G06F 13/4086; H03H 11/30; H03H 7/38
See application file for complete search history.

(56) References Cited

U.S. PATENT DOCUMENTS

| | | | | |
|---|---|---|---|---|
| 6,949,949 | B2* | 9/2005 | Lundberg | H03K 19/0005 326/30 |
| 7,148,721 | B2* | 12/2006 | Park | H03K 19/0005 326/26 |
| 7,768,311 | B2* | 8/2010 | Rathi | H03K 17/04206 326/30 |
| 7,990,196 | B2* | 8/2011 | Voegele | H03K 19/018585 327/108 |
| 8,965,315 | B2* | 2/2015 | Balm | H03F 1/56 307/109 |
| 9,143,112 | B2* | 9/2015 | Zhu | H03H 7/40 |
| 9,768,774 | B2* | 9/2017 | Riad | H03K 19/0005 |
| 2004/0196011 | A1* | 10/2004 | Batey | G05F 1/40 323/273 |
| 2012/0075072 | A1* | 3/2012 | Pappu | H04B 5/0037 340/10.1 |

* cited by examiner

BIASED IMPEDANCE CIRCUIT, IMPEDANCE ADJUSTMENT CIRCUIT, AND ASSOCIATED SIGNAL GENERATOR

This application claims the benefit of U.S. provisional application Ser. No. 62/342,220, filed May 27, 2016, the disclosure of which is incorporated by reference herein in its entirety.

TECHNICAL FIELD

The disclosure relates in general to a biased impedance circuit, an impedance adjustment circuit, and an associated signal generator, and more particularly to a biased impedance circuit, an impedance adjustment circuit and an associated signal generator capable of providing an adjustable biased impedance in response to transition of a periodic input signal.

BACKGROUND

A phase-locked loop (hereinafter, PLL) is a feedback system that compares output phase and input phase to achieve frequency lock, and PLLs are widely used in many communication systems. FIG. 1 is a diagram of a PLL circuit. The PLL circuit 10 includes a phase detector 13, a loop filter 15, a voltage controlled oscillator (hereinafter, VCO) 17, and a divider 19.

In the PLL circuit 10, an input signal and a feedback signal are input to the phase detector 13 which determines a phase difference between these two signals. As shown in FIG. 1, the input signal can be a reference clock $clk_{ref}$ provided by a reference clock generator 11. This phase difference is converted to a control voltage through the loop filter 15. The VCO 17 varies its output frequency in accordance with the control voltage. The output signal of the VCO 17 is divided by the divider 19 to obtain the feedback signal. Then, the feedback signal is fed to the phase detector 13 and compared with the input signal. The phase detector 13 generates the phase difference again. The PLL circuit 10 will track and eventually be locked in frequency and phase within stability.

Phase noise (hereinafter, PN) is a parameter commonly used to describe noise performance of oscillators and is a measure of the power spectral density of the phase angle. Moreover, phase noise in frequency domain is equivalent to jitter in time domain. According to simulation results of integrated phase noise (hereinafter, IPN) of the PLL circuit 10, the reference clock generator 11 is one of the noise sources of phase noise. Therefore, lowering phase noise of the reference clock generator 11 is important for PLL circuit 10.

Generally, lowering the phase noise results in an amplitude loss in the reference clock generator 11, and the amplitude loss may infer that the signal-to-noise ratio (hereinafter, SNR) decreases. The SNR represents the comparison between the level of a desired signal to the level of background noise, and the higher SNR is preferred. Alternatively speaking, the amplitude loss accompanied with lowering the phase noise may worsen the SNR.

Both the phase noise and the amplitude loss are important design metrics for the reference clock generator 11, but implementation of decreasing the phase noise and lowering the amplitude loss are contradictory to each other. Consequentially, design of the reference clock generator 11 becomes a dilemma.

SUMMARY

The disclosure is directed to a biased impedance circuit, an impedance adjustment circuit and an associated signal generator capable of providing an adjustable biased impedance to a summation node for receiving a periodic input signal. During transition of the periodic input signal, the summation node is relatively noise sensitive. Therefore, the adjustable biased impedance is changed in response to transition of the periodic input signal so that a low impedance is applied to the summation node when the periodic input signal significantly transits. By dynamically changing the adjustable biased impedance, the biased impedance circuit, the impedance adjustment circuit and the associated signal generator are capable of balancing the demands of decreasing the phase noise and lowering the amplitude loss.

According to one embodiment, a biased impedance circuit is provided. The biased impedance circuit is coupled to a summation node, and the biased impedance circuit applies a biased impedance to the summation node. A periodic input signal is received at the summation node. The biased impedance circuit includes a switching circuit for receiving an output window signal, wherein a period of the output window signal is shorter than a period of the periodic input signal. The switching circuit includes a low impedance and a high impedance path. The low impedance path sets the biased impedance to a first impedance when the output window signal is at a first voltage level. A duration when the output window signal is at the first voltage level is corresponding to a significant transition of the periodic input signal. The high impedance path sets the biased impedance to a second impedance when the output window signal is at a second voltage level. The first impedance is less than the second impedance.

According to another embodiment, an impedance adjustment circuit is provided. The impedance adjustment circuit is coupled to a summation node, at which a periodic input signal is received. The impedance adjustment circuit applies a biased impedance to the summation node. The impedance adjustment circuit includes a window control circuit and a biased impedance circuit. The window control circuit generates an output window signal according to at least one input window signal. A period of the output window signal is shorter than a period of the periodic input signal, and a period of the at least one input window signal is shorter than or equivalent to the period of the periodic input signal. The biased impedance circuit is coupled to the window control circuit and the summation node. The biased impedance circuit includes a switching circuit, wherein the switching circuit receives the output window signal from the window control circuit. The switching circuit includes a low impedance path and a high impedance path. The low impedance path sets the biased impedance to a first impedance when the output window signal is at a first voltage level. A duration when the output window signal is at the first voltage level is corresponding to a significant transition of the periodic input signal. The high impedance path sets the biased impedance to a second impedance when the output window signal is at a second voltage level. The first impedance is less than the second impedance.

According to an alternative embodiment, a signal generator is provided. The signal generator includes a periodic signal source, an impedance adjustment circuit, and a squaring buffer. The periodic signal source transmits a periodic input signal to a summation node. The impedance adjustment circuit is coupled to the summation node, wherein the impedance adjustment circuit applies a biased impedance to the summation node. The impedance adjustment circuit includes a window control circuit and a biased impedance circuit. The window control circuit generates an output window signal according to at least one input window signal. The biased impedance circuit is coupled to the window control circuit and the summation node. The biased impedance circuit includes a switching circuit, wherein the switching circuit receives the output window signal from the window control circuit. The switching circuit includes a low impedance path and a high impedance path. The low impedance path sets the biased impedance to a first impedance when the output window signal is at a first voltage level. A duration when the output window signal is at the first voltage level is corresponding to a significant transition of the periodic input signal. The high impedance path sets the biased impedance to a second impedance when the output window signal is at a second voltage level. The first impedance is less than the second impedance. The squaring buffer is coupled to the summation node. The squaring buffer generates an adjusted clock signal according to the periodic input signal and a direct current voltage. A period of the output window signal is shorter than a period of the at least one input window signal and a period of the periodic input signal. The period of the periodic input window signal and a period of the adjusted clock signal are equivalent. The period of the at least one input window signal is shorter than or equivalent to the period of the periodic input signal.

Figure 1:
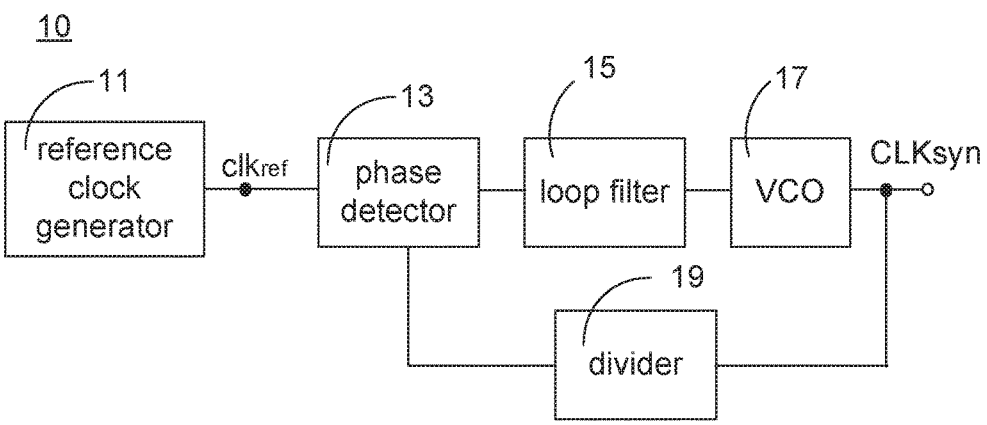
FIG. 1 (prior art) illustrates a PLL circuit.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 2:
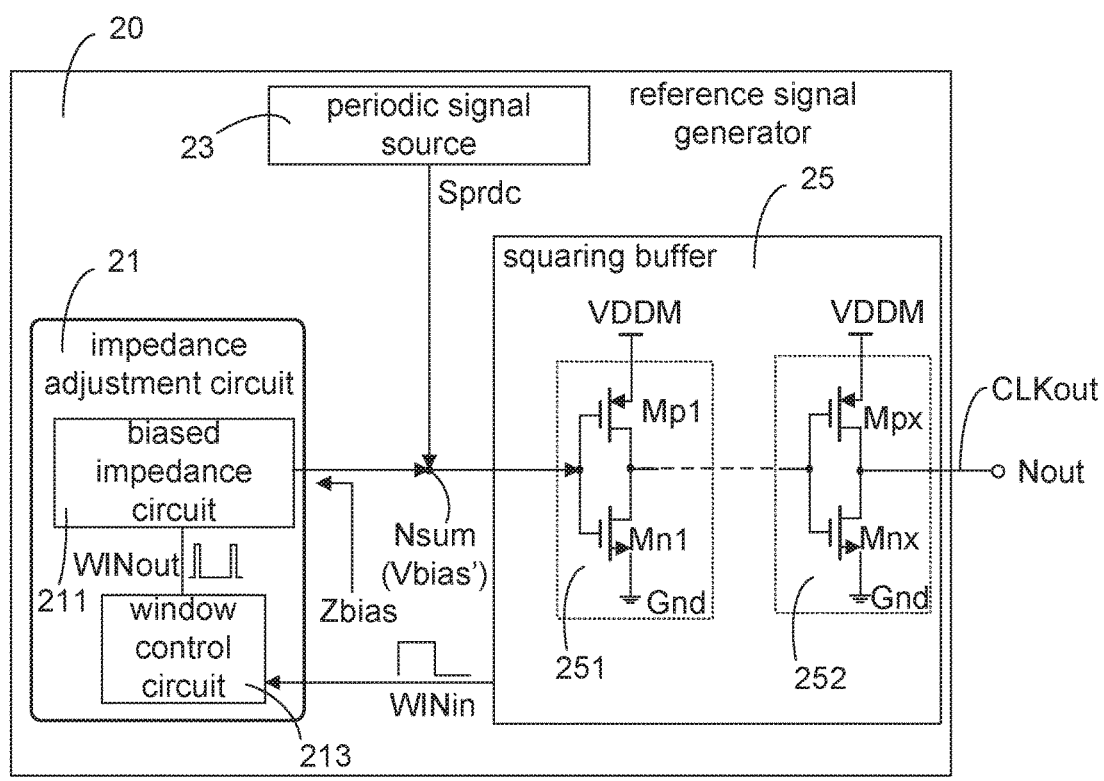
FIG. 2 illustrates a reference signal generator according to an embodiment of the present disclosure.

FIG. 2 is a schematic diagram illustrating a reference signal generator according to an embodiment of the present disclosure. The reference signal generator 20 includes a periodic signal source 23, an impedance adjustment circuit 21 and a squaring buffer 25, which are all coupled to a summation node Nsum. The impedance adjustment circuit 21 further includes a biased impedance circuit 211 and a window control circuit 213.

The periodic signal source 23 generates and transmits a periodic input signal Sprdc to the summation node Nsum. In practical applications, the periodic input signal Sprdc can be a square signal or a sinusoidal signal.

The squaring buffer 25 includes several stages of inverter 251, 252, which are coupled in serial between the summation node Nsum and an output node Nout of the reference signal generator 20. The squaring buffer 25 receives the periodic input signal Sprdc from the summation node Nsum, and generates an adjusted clock signal CLKout at the output node Nout. The adjusted clock signal CLKout can be used as the reference clock $clk_{ref}$ of the PLL circuit. When the periodic input signal Sprdc is a sinusoidal signal, the squaring buffer 25 can transform the sinusoidal signal to a square signal.

As shown in FIG. 2, a first stage inverter 251 includes an NMOS transistor Mn1 and a PMOS transistor Mp1, and a second stage inverter 252 includes an NMOS transistor Mnx and a PMOS transistor Mpx. The PMOS transistor Mp1 is coupled to a voltage source VDDM, the summation node Nsum, and an input of a second stage inverter 252. The NMOS transistor Mn1 is coupled to a ground terminal Gnd, the summation node Nsum and the input of the second stage inverter 252. The PMOS transistor Mpx is coupled to the voltage source VDDM, an output of a previous stage inverter, and an output node Nout of the signal generator 20. The NMOS transistor Mnx is coupled to a ground terminal Gnd, the output of the previous stage inverter, and the output node Nout. The NMOS transistor Mn1 and the PMOS transistor Mp1 are selectively being turned on to generate an output signal of the first stage inverter 251. Phase of the output signal of the first stage inverter 251 is opposite to phase of the periodic input signal Sprdc.

After a series of signal conversion, the squaring buffer 25 generates the adjusted clock signal CLKout at the output node Nout. Moreover, the squaring buffer 25 can output an input window signal WINin to the impedance adjustment circuit 21. The input window signal WINin can be conducted from any of the inverters 251, 252. Therefore, the input window signal and the periodic input signal can be in phase or out of phase. In practical application, the input window signal WINin may originate from the squaring buffer 25, or from an individual reference clock circuit (not shown).

The window control circuit 213 receives the input window signal WINin from the squaring buffer 25 and generates an output window signal WINout in response. A period of the output window signal WINout is shorter than a period of the input window signal WINin, and pulse of the output window signal WINout is narrower than the pulse of the input window signal WINin. Details about the output window signal WINout and the input window signal WINin will be illustrated below.

The biased impedance circuit 211 receives the output window signal WINout from the window control circuit 213, and provides an adjusted biasing voltage Vbias' to the summation node Nsum. In addition, the biased impedance circuit 211 provides adjustable biased impedance Zbias to the summation node Nsum. That is, the biased impedance circuit 211 changes the biased impedance Zbias with time.

Figure 3:
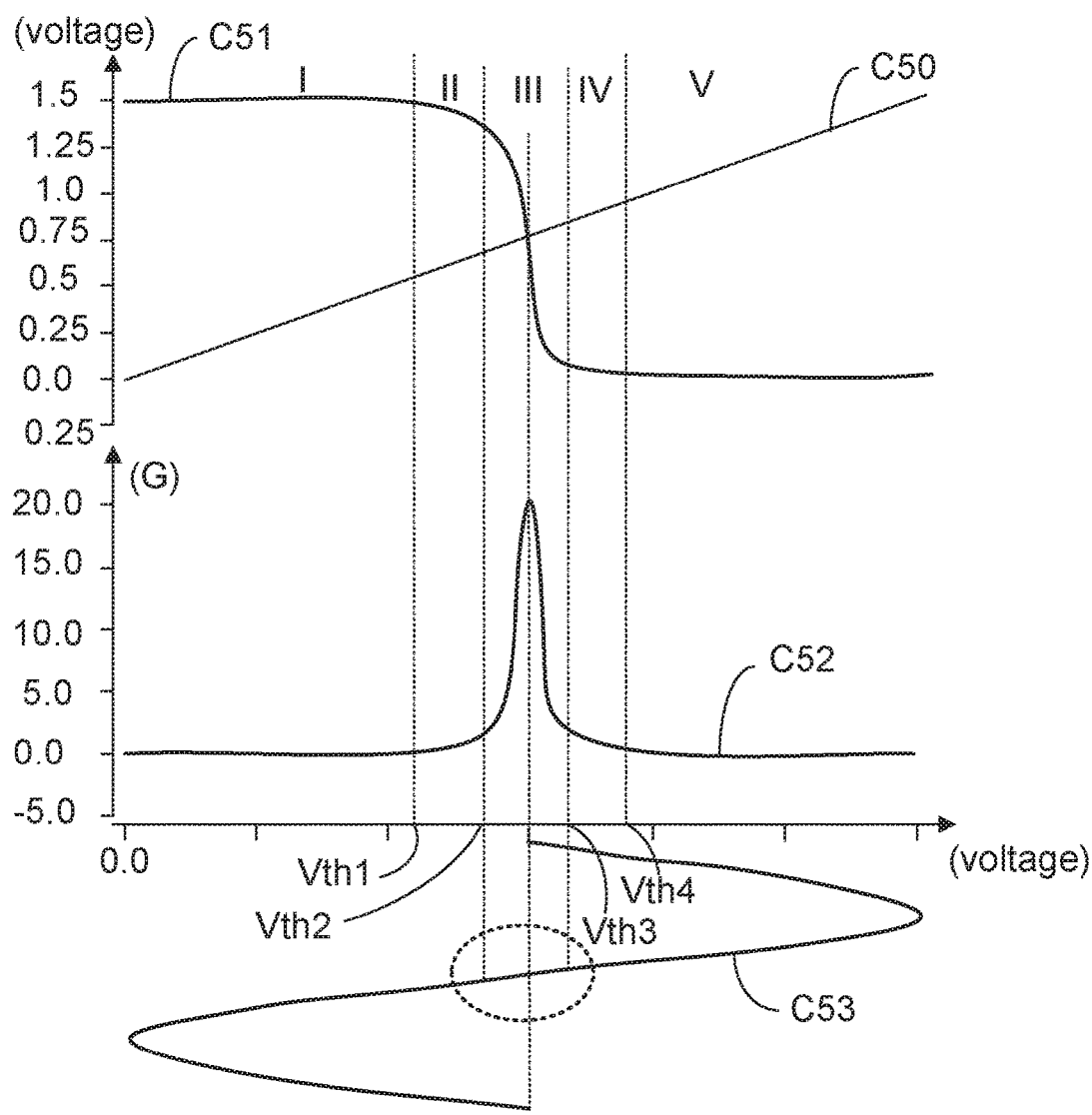
FIG. 3 illustrates transfer characteristic related to the first stage inverter in the squaring buffer.
Figure 4:
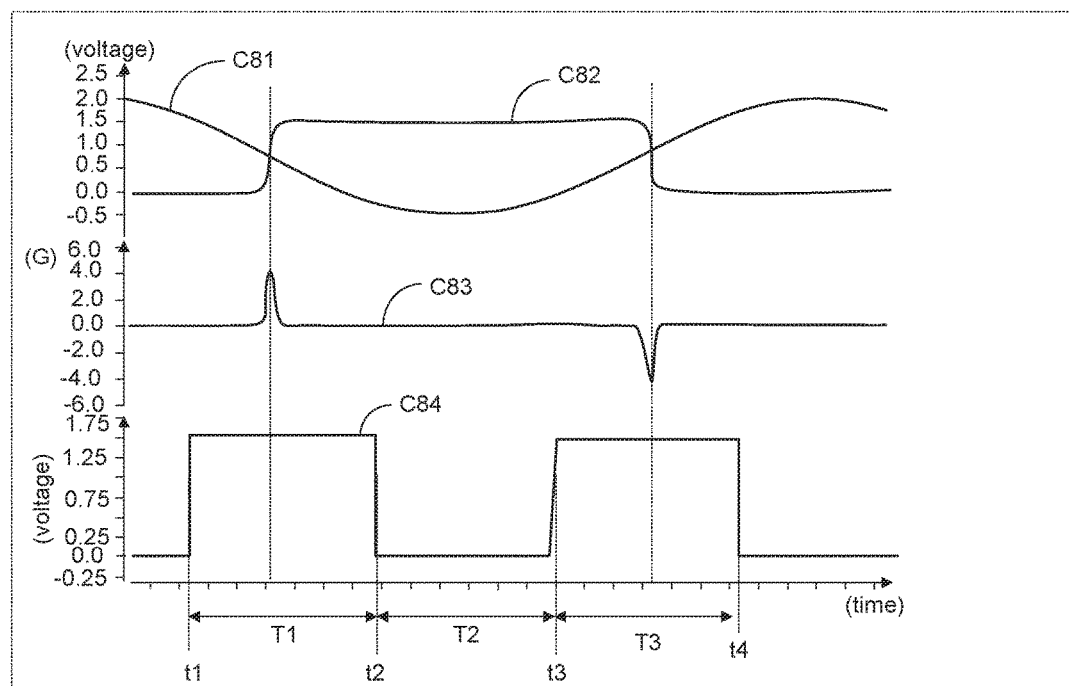
FIG. 4 illustrates generation of the output window signal.
Figure 5:
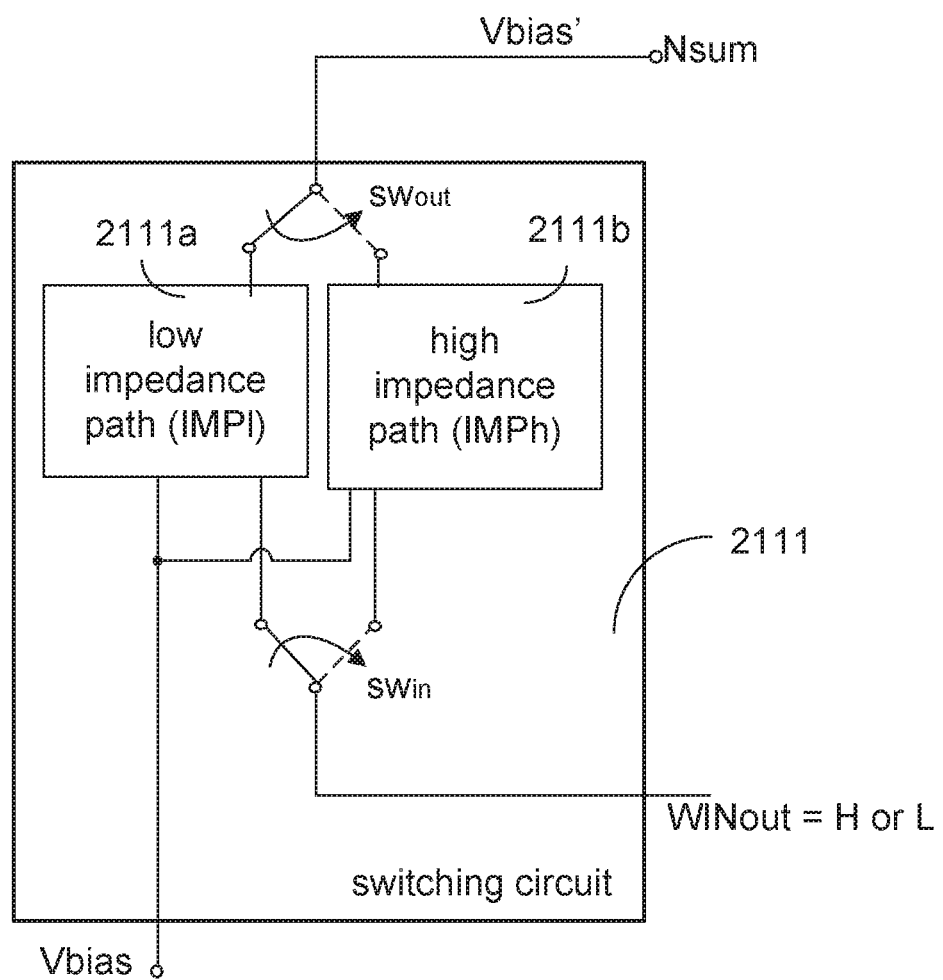
FIG. 5 illustrates a switching circuit in the biased impedance circuit.
Figure 6:
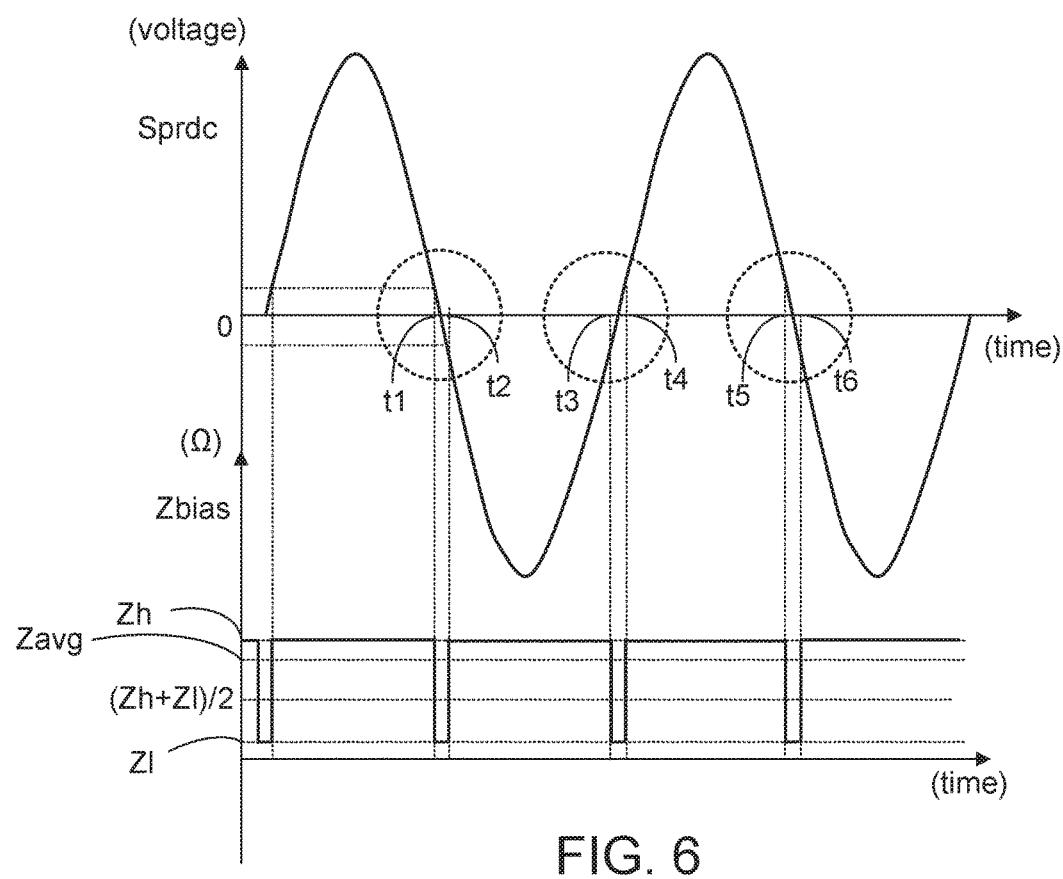
FIG. 6 illustrates impedance applied by the biased impedance circuit is adjusted in response to significant transitions of the periodic input signal.

The operations of the impedance adjustment circuit 21 are illustrated. FIGS. 3 and 4 illustrate characteristics of signals related to the first stage inverter and introduce how the output window signal WINout is utilized to reduce noise. FIGS. 5 and 6 are corresponding to operations of the biased impedance circuit 211 regarding how the output window signal WINout is utilized to adjust the biased impedance Zbias.

FIG. 3 is a diagram illustrating transfer characteristic related to the first stage inverter in the squaring buffer. The waveforms shown in FIG. 3 are respectively illustrated in a top-down order. The horizontal axis is corresponding to amplitude of the periodic input signal Sprdc.

The vertical axis in the first part of the waveform diagram is corresponding to signal amplitude in unit of volts. In the first part of the waveform diagram, an oblique line C50 having a slope of 1 represents changes of the periodic input signal Sprdc, and a curve C51 is corresponding to the output signal of the first stage inverter 251. Change of the output signal of the first stage inverter 251 can be classified into five portions.

Among these five portions, the first portion (I) and the fifth portion (V) are corresponding to the state when the curve C51 are relatively stable, the third portion (III) is corresponding to the state when the curve C51 significantly transits from a relatively high voltage to a relatively low voltage, and the second portion (II) and the fourth portion (IV) are corresponding to the state between the stable states and the significant transition state.

The first portion (I) of curve C51 is corresponding to a range when voltage of the periodic input signal Sprdc is between 0 volt and a first threshold voltage Vth1. In the first portion (I), the PMOS transistor Mp1 is in linear mode and the NMOS transistor Mn1 is in cutoff mode. Therefore, voltage of the output signal of the first stage inverter 251 is equivalent to voltage of the voltage source VDDM.

The second portion (II) of curve C51 is corresponding to a range when voltage of the periodic input signal Sprdc is between the first threshold voltage Vth1 and a second threshold voltage Vth2. In the second portion (II), the PMOS transistor Mp1 is still in linear mode, and the NMOS transistor is in saturation mode. Therefore, voltage of the output signal of the first stage inverter 251 is mainly determined by conduction of the PMOS transistor Mp1 but slightly affected by the NMOS transistor Mn1. Curve C51 shows that voltage of the output signal of the first stage inverter 251 becomes slightly lower than 1.5 volts.

The third portion (III) of curve C51 is corresponding to a range when voltage of the periodic input signal Sprdc is between the second threshold voltage Vth2 and a third threshold voltage Vth3. In the third portion (III), both the PMOS transistor Mp1 and the NMOS transistor Mn1 are in saturation mode. Meanwhile, voltage of the output signal of the first stage inverter 251 significantly transits. The significant transitions of the output signal are accompanied with numerous noises including the biased impedance Zbias, and the saturated transistors (PMOS transistor Mp1 and the NMOS transistor Mn1) further worsen the effects caused by the biased impedance Zbias.

The fourth portion (IV) of curve C51 is corresponding to a range when voltage of the periodic input signal Sprdc is between the third threshold voltage Vth3 and a fourth threshold voltage Vth4. In the fourth portion (IV), the PMOS transistor Mp1 is still in saturation mode, and the NMOS transistor Mn1 is in linear mode. Therefore, voltage of the output signal of the first stage inverter 251 is mainly determined by conduction of the NMOS transistor Mn1 but slightly affected by the PMOS transistor Mp1. Curve C51 shows that voltage of the output signal of the first stage inverter 251 becomes slightly higher than 0 volt.

The fifth portion (V) of curve C51 is corresponding to a range when voltage of the periodic input signal Sprdc is between the fourth threshold voltage Vth4 and the voltage of the voltage source VDDM. In the fifth portion (V), the PMOS transistor Mp1 is in cutoff mode and the NMOS transistor Mn1 is in linear mode. Therefore, voltage of the output signal of the first stage inverter 251 is equivalent to voltage of the ground terminal Gnd, that is, 0 volt.

Curve C52 shown in the second part of the waveform diagram in FIG. 3 is corresponding to absolute value of the differentiated result of curve C51. As shown in the waveform, curve C52 is flat in the first portion (I) and the fifth portion (V); curve C52 is relatively flat in the second portion (II) and the fourth portion (IV); and curve C52 dramatically rises in the third portion (III).

Since curve C51 shows that the output signal of the first stage inverter 251 maintains unchanged in the first portion (I) and the fifth portion (V), curve C52 shows that the differentiated result of curve C51 in these two portions is equivalent to 0. Since curve C51 shows that the output signal of the first stage inverter 251 slightly changes in the second portion (II) and the fourth portion (IV), curve C52 shows that the differentiated result of curve C51 in these two portions is slightly greater than 0. Since curve C51 significantly changes in the third portion (III), curve C52 shows that the differentiated result of curve C1 in the third portion rises abruptly.

Based on changes of curve C52, some characteristics of the output signal of the first stage inverter 251 can be observed and utilized. The abrupt rise of curve C52 in the third portion (III) represents the state that the output signal of the first stage inverter 251 is extremely sensitive to phase noise. The relatively flat regions of curve C52 in the second portion (II) and the fourth portion (IV) represent the state that the output signal of the first stage inverter 251 is relatively insensitive to phase noise. The flat region of curve C52 in the first portion (I) and the fifth portion (V) represent the state that the output signal of the first stage inverter 251 is insensitive to phase noise.

The third part of the waveform diagram in FIG. 3 is corresponding to the periodic input signal Sprdc. The periodic input signal Sprdc is rotated clockwise for 90 degrees so that the amplitude of curve C53 can be easily compared with curves C51 and C52. The dotted circle emphasizes significant transition of curve C53. The significant transition of curve C53 is corresponding to the third portion of curve C51 and the protrusion of curve C52.

FIG. 4 is a diagram illustrating generation of the output window signal. The waveforms shown in FIG. 4 are respectively illustrated in a top-down order. The horizontal axes corresponding to these waveforms are time axes. The vertical axes corresponding to the first and the third waveforms are in unit of volts. The vertical axis corresponding to the second waveform is corresponding to gain of the first stage inverter 251.

The first part of the waveform diagram shows the periodic input signal (curve C81) and the output signal of the first stage inverter 251 (C82). The phase of the periodic input signal Sprdc and the phase of the output signal of the first stage inverter 251 are opposite.

Curve C83 in the second part of the waveform diagram is corresponding to differentiated result of curve C82. Curve C83 abruptly rises when slope of curve C82 is around several billion volts/second, and curve C83 abrupt descends when slope of curve C82 is around negative several billion volts/second. When curve C83 remains flat, curve C83 is equivalent to 0.

Curve C84 in the third part of the waveform diagram is corresponding to the output window signal WINout. Curve C84 rises at time point t1 and time point t3, and drops at time point t2 and time point t4. As shown by curve C84, the output window signal WINout is at high voltage level between time point t1 and time point t2, that is, duration T1, and the output window signal WINout is at low voltage level between time point t2 and time point t3, that is, duration T2.

A period of the output window signal WINout is between time point t1 and time point t3. Alternatively speaking, the period of the output window signal WINout is equivalent to summation of durations T1 and T2. In FIG. 4, durations T1 and T2 are assumed to be equivalent, but duration T1 can be shorter than duration T2 in some cases.

A ratio between a duration when the output window signal WINout is at high voltage level and the period of the output window signal WINout can be defined as a duty cycle of the output window signal WINout. The duty cycle of the output window signal WINout is adjustable and can be less than or equivalent to 50%.

According to the present disclosure, duration T1 is corresponding to the significant transition of curve C81 and C82. Since curve C83 is obtained by differentiating curve C82, the abrupt rise of curve C83 is covered by duration T1, and the abrupt drop of curve C83 is covered by duration T3.

As illustrated in FIG. 2, the window control circuit 213 generates the output window signal WINout according to the input window signal WINin. Then, the window control circuit 213 transmits the output window signal WINout to the biased impedance circuit 211, and the biased impedance circuit 211 operates in response to voltage change of the output window signal WINout.

The internal components of the biased impedance circuit 211 are illustrated in FIG. 5, and how does the biased impedance circuit 211 react according to voltage change of the output window signal WINout is illustrated in FIG. 6.

FIG. 5 is a diagram illustrating the biased impedance circuit. The biased impedance circuit 211 includes a switching circuit 2111, and the switching circuit 2111 further includes a low impedance path (IMPl), a high impedance path (IMPh) and two switches $sw_{in}$, $sw_{out}$. The switches $sw_{in}$, $sw_{out}$ are controlled by the output window signal WINout. In some applications, the biased impedance circuit 211 may further include a bias circuit.

According to the present disclosure, the biased impedance circuit 211 receives the output window signal WINout from the window control circuit 213 and accordingly determines conduction statuses of the switches $sw_{in}$, $sw_{out}$. The switching circuit 2111 receives a direct current voltage (that is, a biasing voltage Vbias) from the bias circuit and accordingly conducts another direct current voltage (that is, an adjusted biasing voltage Vbias') to the summation node Nsum. When the output window signal WINout is at low voltage level, the switches ($Sw_{in}$ and $sw_{out}$) are switched to select the high impedance path (IMPh), and the biased impedance circuit 211 provides the adjusted biasing voltage Vbias' with high impedance (Zh) to the summation node Nsum. The periodic input signal Sprdc and the direct current voltage are jointly superimposed at the summation node Nsum. When the output window signal WINout is at high voltage level, the switches ($sw_{in}$ and $sw_{out}$) are switched to select the low impedance path (IMPl), and the biased impedance circuit 211 provides the adjusted biasing voltage Vbias' with low impedance (Zl) to the summation node Nsum.

FIG. 6 is a diagram illustrating impedance applied by the biased impedance circuit is adjusted in response to significant transitions of the periodic input signal. The waveforms shown in FIG. 6 are respectively illustrated in a top-down order. The horizontal axes are corresponding to time axes.

The first waveform represents the periodic input signal Sprdc. The periodic input signal Sprdc is assumed to be a sinusoidal signal and significant transitions of the periodic input signal Sprdc occur between time point t1 and time point t2, between time point t3 and time point t4, and between time point t5 and time point t6.

The second waveform represents the biased impedance Zbias being applied to the summation node Nsum. The biased impedance Zbias is with low impedance (Zbias=Zl) between time point t1 to time point t2, between time point t3 to time point t4, and between time point t5 to time point 6. The biased impedance Zbias is with high impedance (Zbias=Zh) between time point t2 to time point t3, and between time point t4 to time point t5.

As shown in FIG. 6, duration between time point t1 and time point t2 is shorter than duration between time point t2 and time point t3, and duration between time point t3 and time point t4 is shorter than duration between time point t4 and time point t4. That is, duration corresponding to low impedance (Zl) is shorter than duration corresponding to high impedance (Zh). In consequence, the biased impedance Zbias is with high impedance (Zh) most of the time so that an average impedance (Zavg) being applied to the summation node Nsum is higher than average of high impedance (Zh) and low impedance (Zl), that is, Zavg>(Zh+Zl)/2.

According to the embodiment of the present disclosure, the durations between time points t1 and t2, between time points t3 and t4, and time points t5 and t6 are the durations when the periodic input signal Sprdc significantly transits, and these durations can be defined as significant transit durations. On the other hand, the durations between time points t2 and t3, and time points t4 and t5 are the durations when the periodic input signal Sprdc does not significantly transit, and these durations can be defined as non-significant transit durations.

In the significant transit durations, numerous noises occur and the saturated transistors in the inverters worse the side effects caused by the numerous noises. By switching the biased impedance Zbias to the low impedance (Zl) during the significant transit durations, the side effects caused by the numerous noises can be reduced and limited only in a relatively short duration. Therefore, even if the signal amplitude at the summation node Nsum is affected in the significant transit transitions, the influences caused by lowering the biased impedance Zbias is relatively low for the long term.

In the non-significant transit durations, the biased impedance Zbias is switched to the high impedance Zh and signal amplitude at the summation node Nsum is relatively high. Since the significant transit durations are much shorter than the non-significant transit durations, the amplitude of the summation node is mostly maintained, and the amplitude loss issue can be accordingly solved. Therefore, the demand of decreasing the phase noise can be met by applying the low impedance Zl to the summation node Nsum in the significant transit durations, and the demand of lowering the amplitude loss can be met by applying the high impedance Zh to the summation node Nsum in the non-significant transit durations.

Basically, the biased impedance circuit 211 dynamically adjusts the biased impedance Zbias based on the output window signal WINout, which is corresponding to transitions of the periodic input signal Sprdc.

When transitions of the periodic input signal Sprdc are relatively sharp and significant, the output window signal WINout is at a high voltage level and the biased impedance circuit 211 applies a lower biased impedance (Zbias=Zl) to the summation node Nsum. When transitions of the periodic input signal Sprdc are relatively slow and flat, the output window signal WINout is at a low voltage level and the biased impedance circuit 211 applies a higher biased impedance (Zbias=Zh) to the summation node Nsum.

Source of the input window signal WINin is not limited, and frequency of the input window signal Win can be multiple of frequency of the periodic input signal Sprdc. In the context, the frequency of the input window signal WINin is assumed to be equivalent to the frequency of the periodic input signal Sprdc.

Figure 7A:
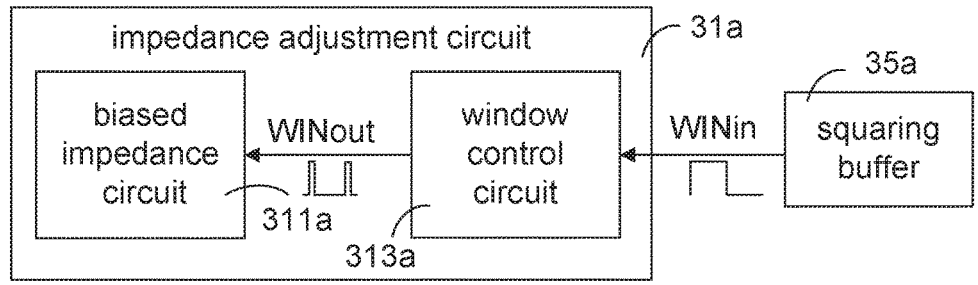
FIGS. 7A and 7B illustrate generation of the output window signal is based on the input window signal.
Figure 7B:
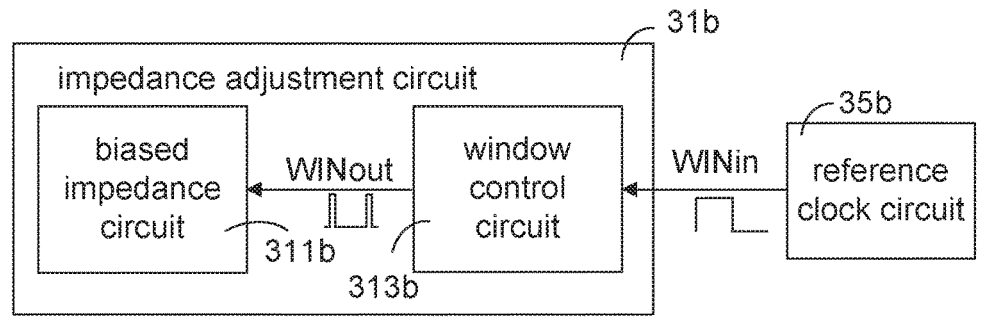

FIGS. 7A and 7B are diagrams illustrating generation of the output window signal WINout is based on the input window signal WINin. Those skilled in the art will readily observe that numerous modifications and alterations may be made while retaining the teachings of the invention. According to the present disclosure, the source of the input window signal WINin is not limited.

In FIG. 7A, the impedance adjustment circuit 31a receives the input window signal WINin from the squaring buffer 35a. The window control circuit 313a generates the output window signal WINout based on the input window signal WINin and transmits the output window signal WINout to the biased impedance circuit 311a.

In FIG. 7B, the impedance adjustment circuit 31b receives the input window signal WINin from a reference clock circuit 35b. The window control circuit 313b generates the output window signal WINout based on the input window signal WINin and transmits the output window signal WINout to the biased impedance circuit 311b.

Figure 8:
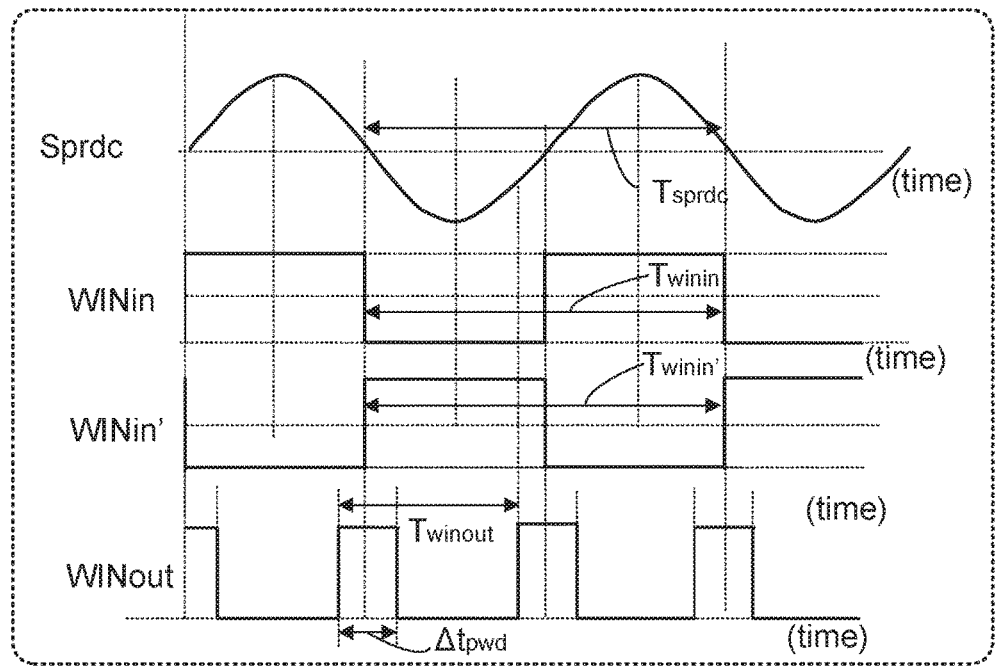
FIG. 8 illustrates generation of the input window signal is based on the periodic input signal.

FIG. 8 is a diagram illustrating generation of the input window signal is based on the periodic input signal. The waveforms shown in FIG. 8 are respectively illustrated in a top-down order. The horizontal axes are corresponding to time axes.

The first waveform represents the periodic input signal Sprdc, the second and the third waveforms respectively represent two types of the input window signal (WINin and WINin'), and the fourth waveform represents the output window signal WINout. The first type of the input window signal WINin is assumed to be in phase with the periodic input signal Sprdc, and the second type of the input window signal WINin' is assume to be out of phase with the periodic input signal Sprdc.

Period of the periodic input signal Sprdc is represented as $T_{sprdc}$, period of the first type of the input window signal WINin is represented as $T_{winin}$, period of the second type of the input window signal WINin' is represented as $T_{winin'}$, and period of the output window signal WINout is represented as $T_{winout}$. According to the embodiment of the present disclosure, the period of the output window signal $T_{winout}$, is shorter than the period of the periodic input signal $T_{sprdc}$, and the periods of the input window signals ($T_{winin}$ and $T_{winin'}$) are shorter than or equivalent to the period of the periodic input signal $T_{sprdc}$.

The period of the output window signal $T_{winout}$ is equivalent to half of that of the periodic input signal $T_{sprdc}$. Duration when the output window signal WINout is at high voltage level (that is, a pulse width) is represented as Δtpwd, which is preferred to be shorter than half of the period of the output window signal $T_{winout}$.

The adjusted clock signal CLKout is generated based on the signal of the summation node Nsum. The periodic input signal Sprdc and the biased impedance Zbias are received at the summation node Nsum, and the biased impedance Zbias affects characteristics of the periodic input signal Sprdc.

A low biased impedance (Zbias=Zl) is applied to the summation node Nsum during significant transition of the periodic input signal Sprdc. Providing the low biased impedance at the significant transitions of the periodic input signal Sprdc can improve the phase noise of the adjusted clock signal CLKout. On the contrary, a high biased impedance (Zbias=Zh) is applied to the summation node Nsum during non-significant transition of the periodic input signal Sprdc. Providing the high biased impedance at the non-significant transition of the periodic input signal Sprdc can keep the amplitude of the periodic input signal Sprdc at the summation node Nsum.

Figure 9:
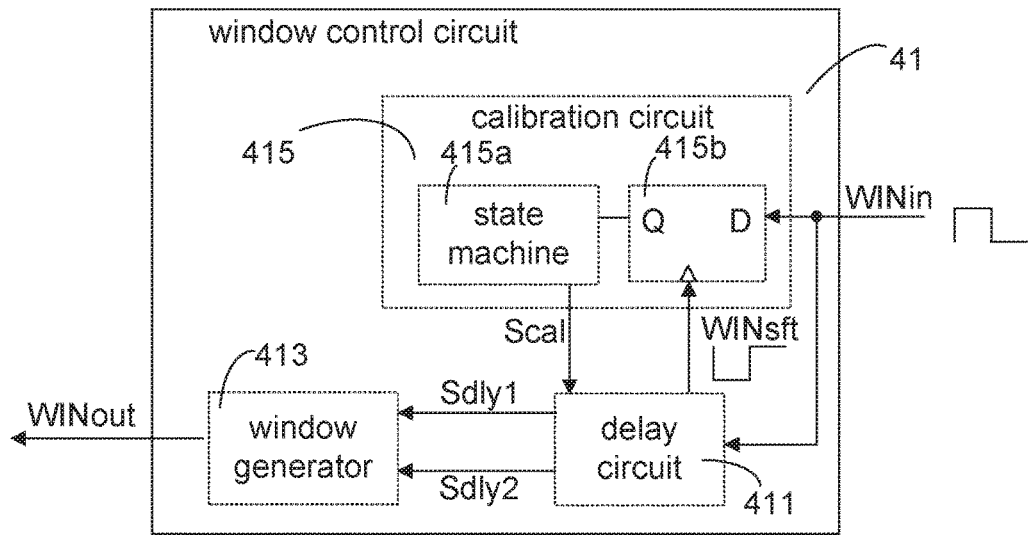
FIG. 9 illustrates components in the window control circuit.

The components in the window control circuit 41 are briefly introduced in FIG. 9. FIG. 9 is a diagram illustrating components in the window control circuit. The window control circuit 41 includes a window generator 413 and a delay circuit 411. The delay circuit 411 receives the input window signal WINin and accordingly generates a first delay signal Sdly1 and a second delay signal Sdly2. After receiving the first and the second delay signals Sdly1, Sdly2, the window generator 413 generates the output window signal WINout.

The window control circuit 41 may further include a calibration circuit 415. The calibration circuit 415 includes a D flip-flop 415b and a state machine 415a. The D flip-flop 415b receives the input window signal WINin as its input and triggered by a shift window signal WINsft. The output of the D flip-flop 415b is transmitted to the state machine 415a, and the state machine 415a generates a calibration signal Scal to the delay circuit 411.

Generation of the output window signal WINout can include two aspects, timing alignment between edges of the shift window signal WINsft and edges of the input window signal WINin, and the pulse width (Δtpwd) of the output window signal WINout. These two aspects of the output window signal WINout are respectively related to operations of the calibration circuit 415 and the delay circuit 411.

The calibration circuit 415 generates the calibration signal Scal to adjust timing of the shift window signal WINsft so that the shift window signal WINsft can align to edges of the input window signal WINin. Then, edges of the shift window signal WINsft can be referred as principle timing to generate the first delay signal Sdly1 and the second delay signal Sdly2. Moreover, level of the output window signal WINout is changed based on the first delay signal Sdly1 and the second delay signal Sdly2. Details about how the calibration circuit 415 aligns edges of the shift window signal WINsft with edges of the input window signal WINin are illustrated in FIG. 10.

Figure 11A:
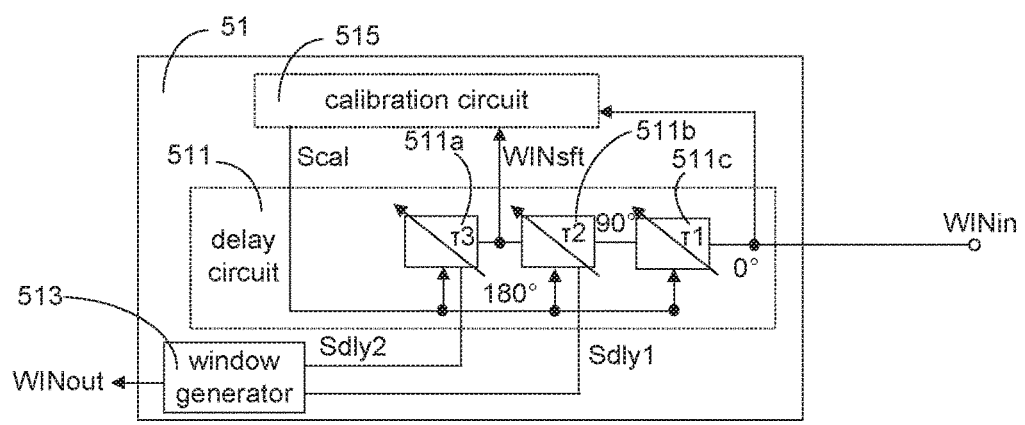
FIG. 11A illustrates generation of the first delay signal, the second delay signal and the output window signal.
Figure 11B:
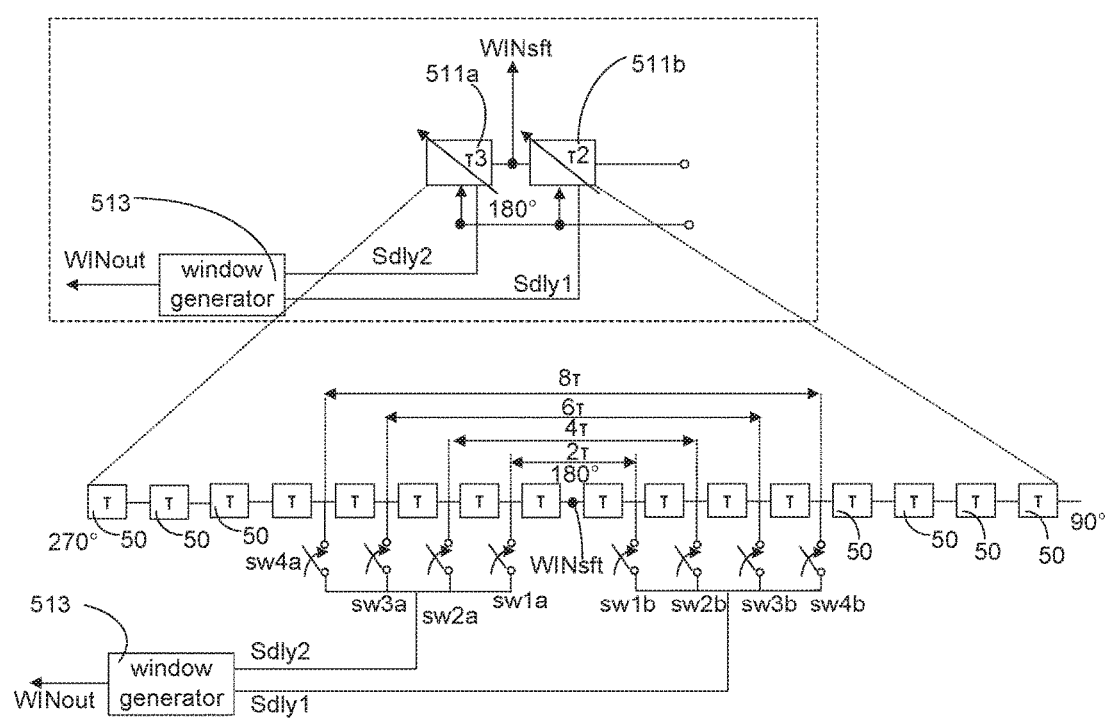
FIG. 11B illustrates components in the delay circuit.
Figure 12:
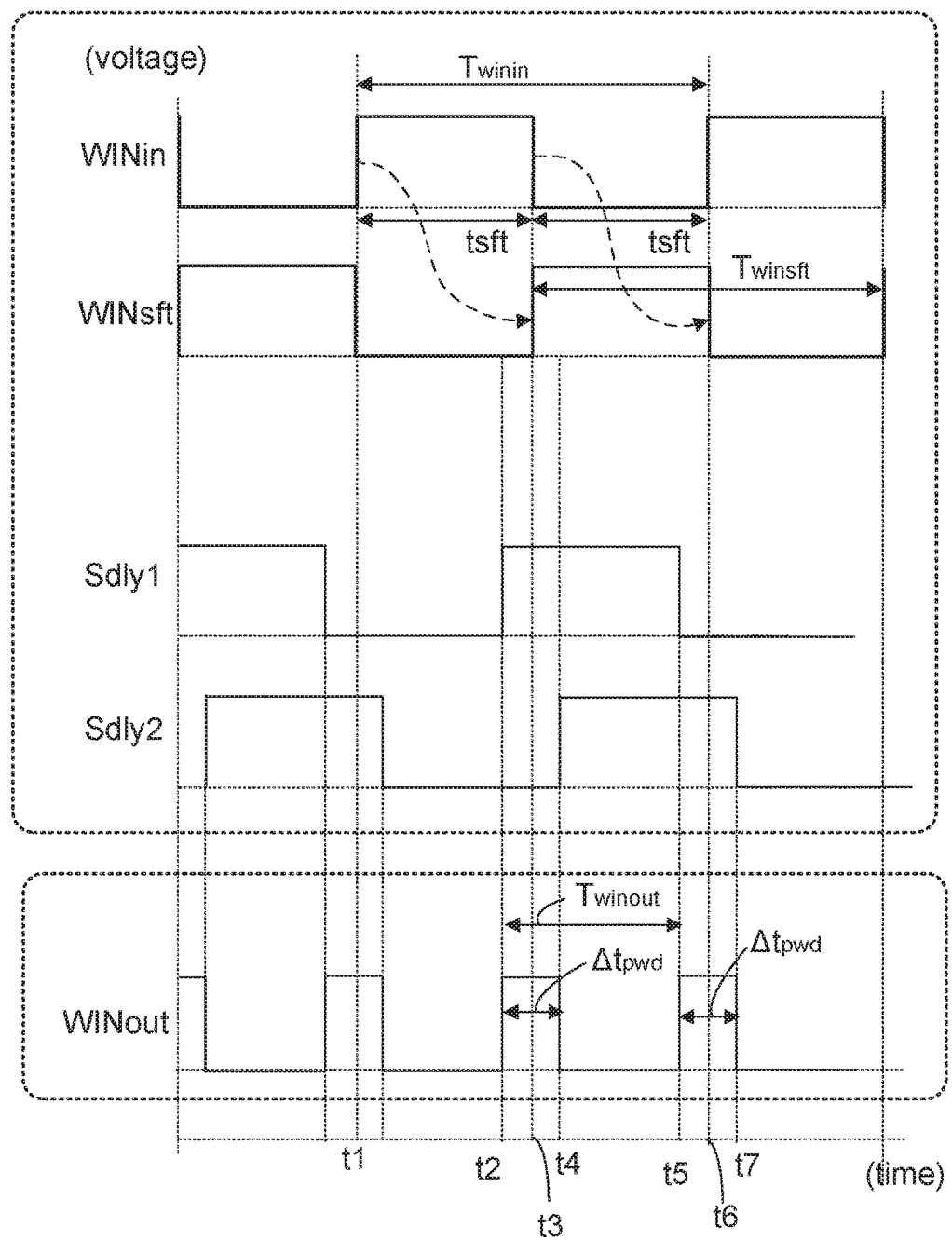
FIG. 12 illustrates the first delay signal, the second delay signal and the output window signal.

On the contrary, the delay circuit 411 adjusts the pulse width (Δtpwd) of the output window signal WINout by controlling the first delay signal Sdly1 and the second delay signal Sdly2. Details about how the delay circuit 411 adjusts the first delay signal Sdly1 and the second delay signal Sdly2 are illustrated in FIGS. 11A, 11B and 12.

Figure 10:
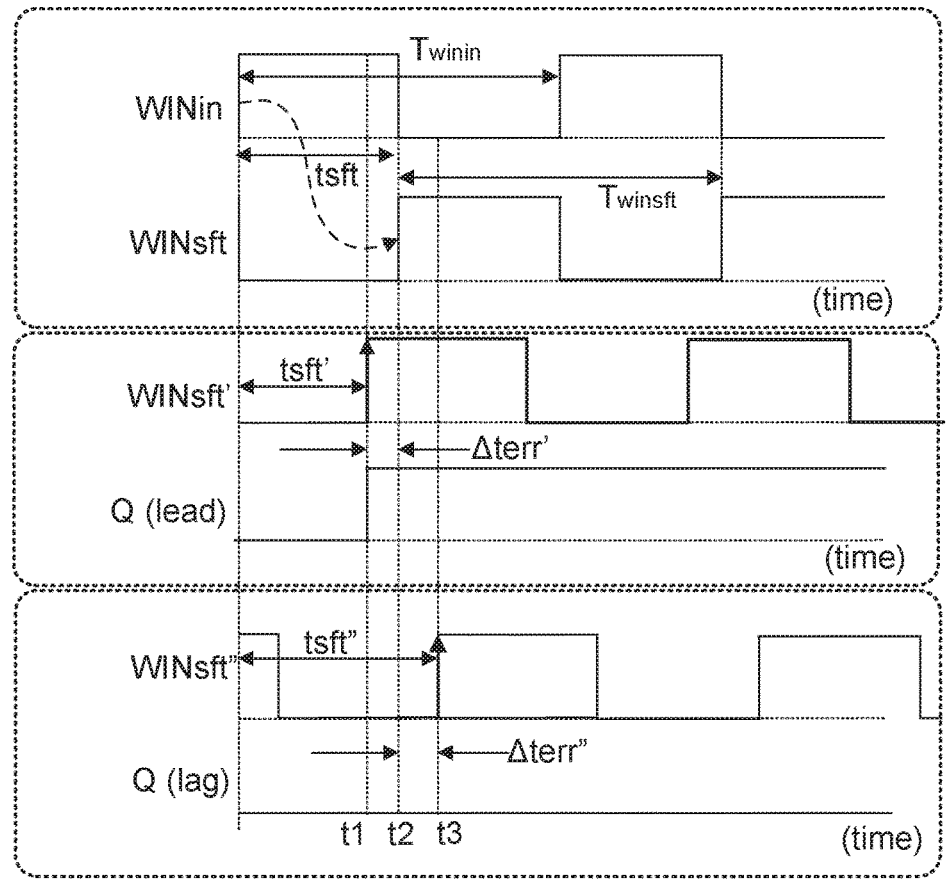
FIG. 10 illustrates how to calibrate precision of the shift window signal.

FIG. 10 is a diagram illustrating how to calibrate precision of the shift window signal WINsft. The waveforms shown in FIG. 10 are respectively illustrated in a top-down order. The horizontal axes are corresponding to time axes.

In the first part of the waveform diagram, the input window signal WINin and the shift window signal WINsft are shown. The shift window signal WINsft is generated by shifting the input window signal WINin for a shift duration tsft. The period of the shift window signal $T_{winsft}$ is equivalent to the period of the input window signal $T_{winin}$, that is, $T_{winsft}=T_{winin}$.

In ideal case, the shift duration tsft is equivalent to half of the period of the input window signal $T_{winin}$, that is, tsft=½*$T_{winin}$. When the shift duration tsft is precisely equivalent to half of the period of the input window signal, rising edges of the shift window signal $T_{winsft}$ are corresponding to falling edges of the input window signal WINin, and vice versa.

However, in practical applications, the shift duration tsft may not be precisely equivalent to half of the period of the input window signal, that is, tsft≠½*$T_{winin}$. In consequence, the rising edges of the shift window signal $T_{winsft}$ may lead or lag the falling edges of the input window signal WINin. According to the embodiment of the present disclosure, an output signal Q is used to notify the state machine 415a that the shift window signal WINsft leads or lags the input window signal WINin.

In the second part of the waveform diagram, the shift duration tsft' is assumed to be shorter than half of the period of the input window signal (tsft'<½*$T_{winin}$), and the rising edges of the shift window signal WINsft' are prior to the falling edges of the input window signal WINin. A time difference Δterr' between time point t1 and time point t2 represents the leading duration of the shift window signal WINsft'. In such case, the D flip-flop 415b generates the output signal Q with "1" to the state machine 415a, and the state machine 415a accordingly generates the calibration signal Scal to notify the delay circuit 411 that the shift window signal WINsft leads the input window signal WINin.

In the third part of the waveform diagram, the shift duration tsft" is assumed to be longer than half of the period of the input window signal (tsft">½*$T_{winin}$), and the rising edges of the shift window signal WINsft" are behind the falling edges of the input window signal WINin. A time difference Δterr" between time point t2 and time point t3 represents the lagging duration of the shift window signal WINsft". In such case, the D flip-flop 415b generates the output signal Q with "0" to the state machine 415a, and the state machine 415a accordingly generates the calibration signal Scal to notify the delay circuit 411 that the shift window signal WINsft lags the input window signal WINin.

After receiving the calibration signal Scal, the delay circuit 411 can adjust timing of the shift window signal WINsft so that phase difference between the shift window signal WINsft and the input window signal WINin can be maintained as 180 degrees.

FIG. 11A is a diagram illustrating generation of the first delay signal, the second delay signal and the output window signal. The window control circuit includes a window generator 513, a delay circuit 511, and a calibration circuit 515. The delay circuit 511 is coupled with the calibration circuit 515 and the window generator 513. The delay circuit 511 includes three delay modules 511a, 511b, 511c, and each of which provides 90 degrees of phase delay.

The input window signal WINin is received by the delay module 511c and the calibration circuit 515. The delay module 511c shifts the input window signal WINin with 90 degrees and accordingly generates a first delay module signal to the delay module 511b. The delay module 511b further shifts the first delay module signal with 90 degrees and accordingly generates a second delay module signal to the delay module 511a. Therefore, in an ideal situation, the first delay module signal lags the input window signal WINin for 90 degrees, and the second delay module signal lags the input window signal WINin for 180 degrees. The second delay module signal is utilized as a shift window signal WINsft being transmitted to the calibration circuit 515.

The calibration circuit 511 receives the input window signal WINin from the window control circuit, and receives the shift window signal WINsft from the delay module 511b. The calibration circuit 511 compares the input window signal WINin with the shift window signal WINsft and accordingly generates the calibration signal Scal to the delay modules 511a, 511b, 511c. The delay modules 511a, 511 b, 511c can adjust internal settings in response to the calibration signal Scal.

The delay modules 511a, 511b, 511 c generate a first delay signal Sdly1 and a second delay signal Sdly2. The first delay signal Sdly1 leads the shift window signal WINsft but lags the input window signal WINin. The second delay signal Sdly2 lags the shift window signal WINsft. Phase difference between the first delay signal Sdly1 and the input window signal WINin is between 90 degrees to 180 degrees. On the other hand, phase difference between the second delay signal Sdly2 and the input window signal WINin is between 180 degrees to 270 degrees.

In FIG. 11A, the window generator 513 is an exclusive or (XOR) logic gate, but implementation of the window generator 513 is not limited. The window generator 513 generates the output window signal WINout according to the first delay signal Sdly1 and the second delay signal Sdly2.

FIG. 11B is a diagram illustrating internal components of the delay module. Each of the delay modules 511a, 511b includes 8 delay units 50, and each of the delay units 50 is corresponding to 90/8 degrees. In a case that the frequency of the input window signal WINin is equivalent to 40 MHz, a period of the input window signal WINin is equivalent to 25 ns. Therefore, each of the delay units 50 is corresponding to a delay duration unit τ, and the delay duration unit τ is around 781.25 picoseconds.

In FIG. 11B, switches sw1a, sw2a, sw3a, sw4a are coupled to delay units 50 in the delay module 511a, and switches sw1b, sw2b, sw3b, sw4b are coupled to delay units 50 in the delay module 511b. As illustrated above, the delay module 511b generates the first delay signal Sdly1 and the shift window signal WINsft, and the delay module 511a generates the second delay signal Sdly2. As shown in FIG. 11B, one of the switches (sw1a, sw2a, sw3a, sw4a) is turned on to conduct the second delay signal Sdly2 from the delay module 511*a*, and one of the switches (sw1*b*, sw2*b*, sw3*b*, sw4*b*) is turned on to conduct the first delay signal Sdly1 from the delay module 511*b*.

Furthermore, these switches can be grouped into four pairs and switches in the same pair are simultaneously turned on or turned off. Only one pair of switches is selected to be turned on, and the selected pair of switches determines the time difference between the first delay signal Sdly1 and the second delay signal Sdly2.

For example, when the switch sw1*a* conducts the rightmost delay unit 50 in the delay module 511*a*, the switch sw1*b* conducts the leftmost delay unit 50 in the delay module 511*b*. When both the switches sw1*a* and sw1*b* are turned on, phase difference between the second delay signal Sdly2 and the first delay signal Sdly1 is equivalent to twice of the delay duration unit 2*τ.

FIG. 12 is a waveform diagram illustrating the first delay signal Sdly1, the second delay signal Sdly2 and the output window signal WINout. The waveforms shown in FIG. 12 are respectively illustrated in a top-down order. The horizontal axes are corresponding to time axes.

In FIG. 12, the first waveform represents the input window signal WINin, and the second waveform represents the shift window signal WINsft. The third waveform is the first delay signal Sdly1 leading the shift window signal WINsft, and the fourth waveform is the second delay signal Sdly2 lagging the shift window signal WINsft. The fifth waveform is the output window signal WINout.

The shift window signal WINsft is generated by delaying the input window signal WINin for the shift duration tsft. Therefore, the rising edge of the input window signal WINin at time point t1 is delayed for the shift duration tsft to generate the rising edge of the shift window signal WINsft at time point t3. Similarly, the falling edge of the input window signal WINin at time point t3 is delayed for the shift duration tsft to generate the falling edge of the shift window signal WINsft at time point t6.

In an ideal case, the shift duration tsft is precisely equivalent to half of the period of the input window signal WINin. Otherwise, timing of the shift window signal WINsft needs to be calibrated (as illustrated in FIG. 10).

As illustrated in FIG. 11B, the delay circuit generates the first delay signal Sdly1 which leads the shift window signal WINsft with a leading phase, and the delay circuit generates the second delay signal Sdly2 which lags the shift window signal WINsft with a lagging phase. The leading phase and the lagging phase also represent a duration (time difference) between the delay signals (Sdly1 and Sdly2) and the shift window signal WINsft. In FIG. 12, the leading phase that the first delay signal Sdly1 leads the shift window signal WINsft is corresponding to the duration between time point t2 and time point t3, and the duration between time point t5 and time point t6. Moreover, the lagging phase that the second delay signal Sdly2 lags the shift window signal WINsft is corresponding to the duration between time point t3 and time point t4, and the duration between time point t6 and time point t7.

The window generator generates the output window signal WINout according to the first delay signal Sdly1 and the second delay signal Sdly2. According to the embodiment of the present disclosure, the output window signal WINout is at high voltage level when only one of the first delay signal Sdly1 and the second delay signal Sdly2 is at high voltage level. The fifth waveform in FIG. 12 shows that duration when the output window signal WINout is at high voltage level, that is, the pulse width of the output window signal WINout, is between time point t2 and time point t4, and between time point t5 and time point t7.

The period ($T_{winout}$) of the output window signal WINout can be, for example, between time point t2 and time point t5. The period of the input window signal WINin ($T_{winin}$) can be, for example, between time point t1 and time point t6. The period of the output window signal WINout is equivalent to half of the period of the input window signal WINin.

The duty cycle of the output window signal WINout can be defined by the pulse width (Δtpwd) and period of the output window signal WINout, that is, $\Delta tpwd/T_{winout}$. In order to achieve better effects of impedance switching function, shorter pulse width (Δtpwd) of the output window signal WINout for only noise sensitive duration is desired. Alternatively speaking, the duty cycle of the output window signal WINout is preferred to be less than or equivalent to 50%.

Figure 13:
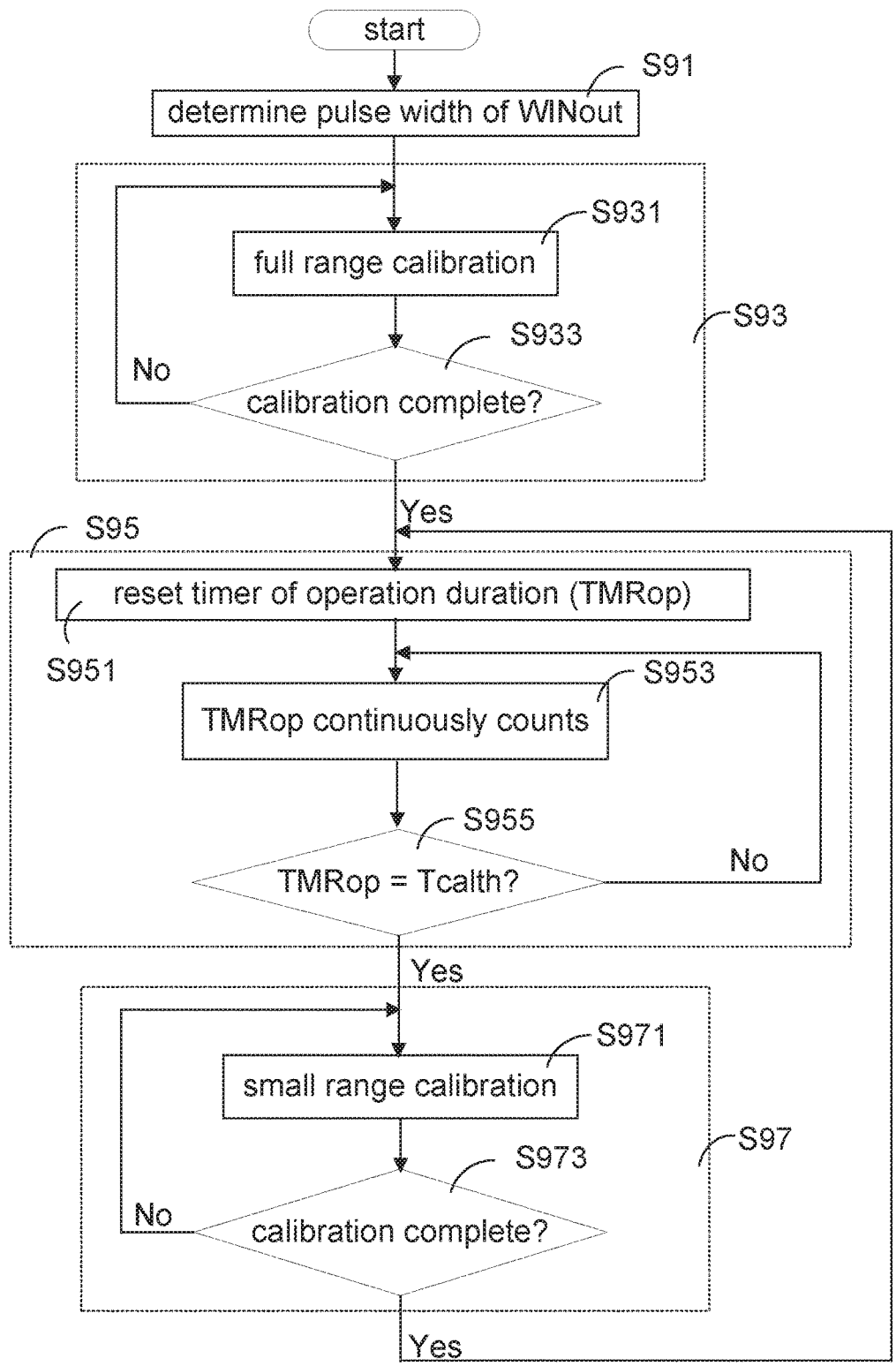
FIG. 13 illustrates calibration procedure of the signals related to the window control circuit.

FIG. 13 is a flow diagram illustrating calibration procedure of the signals related to the window control circuit. The operation of the swing control can be separated into two parts, a first part is corresponding to initialization or a setup stage, and a second part is corresponding to normal operation stage. The calibration procedure related to the shift window signal WINsft can be executed in different stages whenever necessary.

In FIG. 13, steps S91 and S93 are executed in the initialization stage, and steps S95 and S97 are executed in the normal operation stage. During the initialization stage, pulse width of the output window signal WINout is firstly determined (step S91). Then, a full range calibration of the shift window signal WINsft is continually performed (step S931). In step S933, whether the full range calibration of the shift window signal WINsft is complete is determined (step S933). If the determination result of step S933 is negative, step S931 is repeatedly executed. Otherwise, the normal operation stage starts, and the calibrated shift window signal WINsft is used in the normal operation stage.

In the normal operation stage, a timer of operation duration (TMRop) is used to control the period of performing a small range calibration. In step S951, the timer of operation duration (TMRop) is reset. Then, the timer of operation duration (TMRop) starts to count (step S953). In step S955, counting result of the timer of operation duration TMRop is compared with a calibration threshold Tcalth.

If the counting result of the timer of operation duration TMRop is less than the calibration threshold Tcalth, step S953 is repeatedly executed. If the counting result of the timer of operation duration TMRop is equivalent to the calibration threshold Tcalth, the small range calibration of the shift window signal WINsft is performed (S971). The small range calibration of the shift window signal WINsft is continually performed until the small range calibration is determined to be complete (step S973). In a case that the small range calibration of the shift window signal WINsft is determined to be incomplete, step S971 is repeatedly executed. In a case that the small range calibration of the shift window signal WINsft is determined to be complete, step S95 is repeatedly executed.

Both the full range calibration and the small range calibration intend to find a range of timing to generate edges of the shift window signal WINsft. Therefore, execution of the full range calibration in step S931 and the small range calibration in step S971 are basically similar except some parameter settings including a calibration bit number.

In the initialization stage, the shift window signal WINsft is usually drifted from a desired timing due to process, voltage and temperature (hereinafter, PVT) variation, and the full range calibration is performed. The shift window signal WINsft is calibrated by adjusting delay of the delay unit (such as its VDD, driving capability or loading). Basically, most of the drift caused by the process variation has been calibrated in the initialization stage, and only the drift caused by the temperature variation needs to be concerned in the normal operation stage. Therefore, the small range calibration is performed in the normal operation stage.

Moreover, the calibration bit number represents the total number of delay steps that a certain delay difference can be divided. For the full range calibration, the calibration bit number is assumed to be equivalent to 10, and the curtain delay difference is equivalently divided into 1023 different delay steps (that is, 1024 settings are available). Then, the full range calibration intends to find an appropriate setting for the shift window signal WINsft.

The calibration number corresponding to the small range calibration is selectable. When the calibration bit number is assumed to be equivalent to 2, the desired delay is searched within +2/−2 codes based on the calibration result of a previous calibration (for example: 511+2/−2).

The calibration bit number of the full range calibration is larger than small range calibration. For example, the calibration bit number in the full range calibration can be set to be 7~10 bits, and the calibration bit number in the small range calibration can be set to be 2~3 bits.

Figure 14:
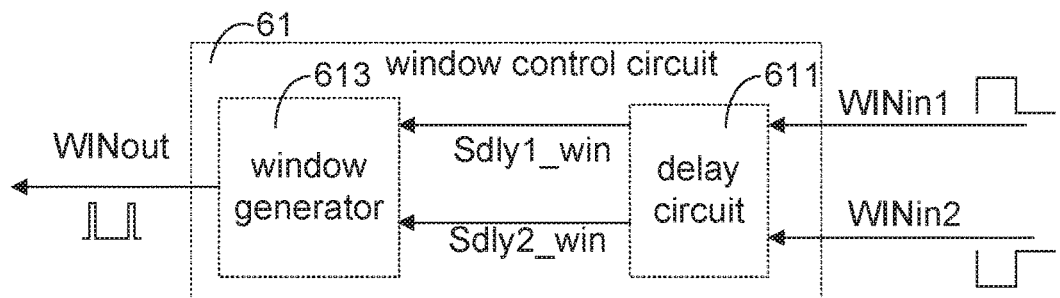
FIG. 14 illustrates generation of the shift window signal another embodiment of the present disclosure.
Figure 15A:
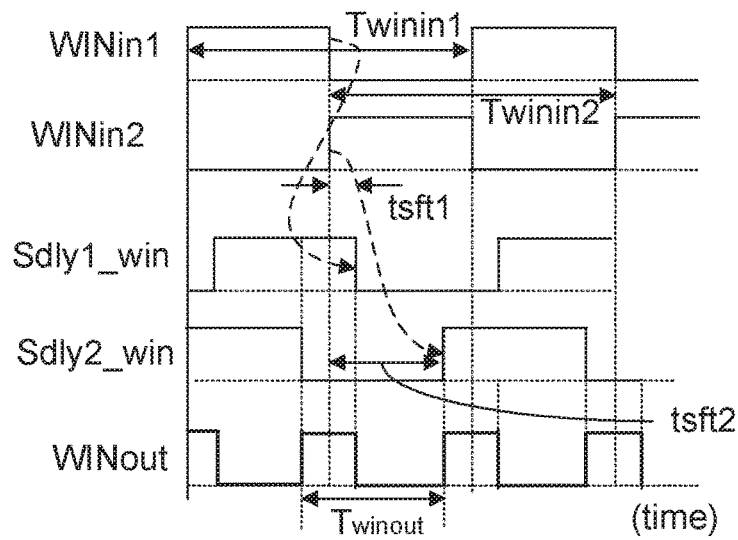
FIGS. 15A and 15B illustrate the output window signal can be generated based on utilization different combination of delay units.
Figure 15B:
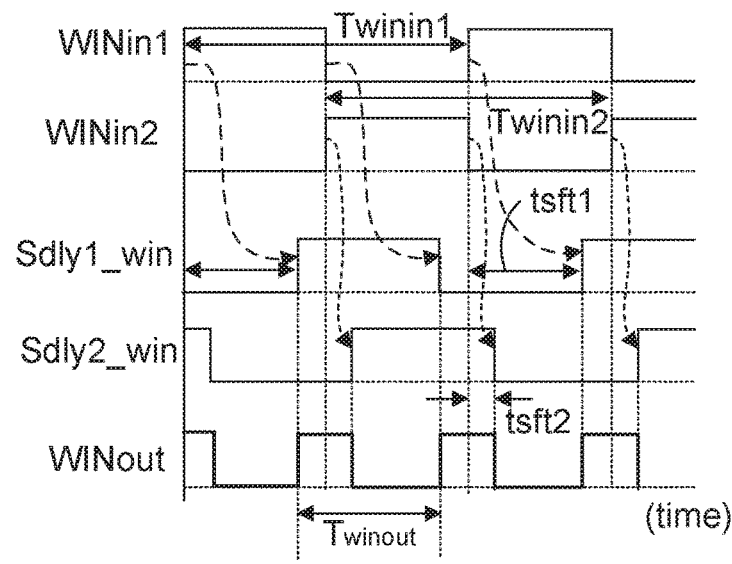

In practical application, the output window signal WINout can be generated based on different types of implementations. FIGS. 14, 15A and 15B is an alternative implementation showing that the periodic input signal Sprdc is not required to be used directly to generate the input window signal WINin.

FIG. 14 is a diagram illustrating generation of the shift window signal another embodiment of the present disclosure. The window control circuit 61 includes a delay circuit 611 and a window generator 613. The delay circuit 611 receives a first input window signal WINin1 and a second input window signal WINin2. At least one of the first input window signal WINin1 and the second input window signal WINin2 is in phase with the periodic input signal Sprdc. Moreover, the period of the periodic input signal Sprdc ($T_{sprdc}$) is equivalent to multiple of the period of the first input window signal WINin1 ($T_{winin}$) and the period of the second input window signal WINin2 ($T_{winin2}$).

The delay circuit 611 generates a first delay signal Sdly1_win and a second delay signal Sdly2_win according to the first input window signal WINin1 and the second input window signal WINin2, respectively. The window generator 613 receives the first delay signal Sdly1_win and the second delay signal Sdly2_win from the delay circuit 611 and accordingly generates the output window signal WINout.

FIGS. 15A and 15B are diagrams illustrating the output window signal can be generated based on utilization different combination of delay units 50. The horizontal axes in FIGS. 15AA and 15B are corresponding to time axes. For the sake of illustration, the first input window signal WINin1 and the second input window signal WINin2 are assumed to be out of phase in FIGS. 15A and 15B. Moreover, the period of the periodic input signal Sprdc ($T_{sprdc}$), the period of the first input window signal WINin1 ($T_{winin1}$) and the period of the second input window signal WINin2 ($T_{winin2}$) are assumed to be equivalent, that is, $T_{sprdc}=T_{winin1}=T_{winin2}$.

In FIGS. 15A and 15B, the first input window signal WINin1 is delayed for a first shift duration tsft1 to generate the first delay signal Sdly1_win, and the second input window signal WINin2 is delayed for a second shift duration tsft2 to generate the second delay signal Sdly2_win.

In FIG. 15A, it is assumed that the first shift duration tsft1 is shorter than the second shift duration tsft2. The relationship between the first delay signal Sdly1_win and the second delay signal Sdly2_win in FIG. 15A can be respectively analogous to the relationship between the second delay signal Sdly2 and the first delay signal Sdly1 in FIG. 12. Therefore, the window generator 613 can generate the output window signal WINout based on the first delay signal Sdly1_win and the second delay signal Sdly2_win.

As shown in FIG. 15A, the rising edges of the output window signal WINout are corresponding to the falling/rising edges of the second delay signal Sdly2_win, and the falling edges of the output window signal WINout are corresponding to the falling/rising edges of the first delay signal Sdly1_win. The period of the output window signal WINout is equivalent to half of the period of the first input window signal WINin1, that is, $T_{winout}=\frac{1}{2}T_{winin1}$.

In FIG. 15B, it is assumed that the first shift duration tsft1 is longer than the second shift duration tsft2. The relationship between the first delay signal Sdly1_win and the second delay signal Sdly2_win in FIG. 15B can be respectively analogous to the relationship between the first delay signal Sdly1 and the second delay signal Sdly2 in FIG. 12. Therefore, the window generator 613 can generate the output window signal WINout based on the first delay signal Sdly1_win and the second delay signal Sdly2_win.

As shown in FIG. 15B, the rising edges of the output window signal WINout are corresponding to the falling/rising edges of the first delay signal Sdly1_win, and the falling edges of the output window signal WINout are corresponding to the falling/rising edges of the second delay signal Sdly2_win. The period of the output window signal WINout is equivalent to half of the period of the first input window signal WINin1, that is, $T_{winout}=\frac{1}{2}*T_{winin1}$.

Figure 16A:
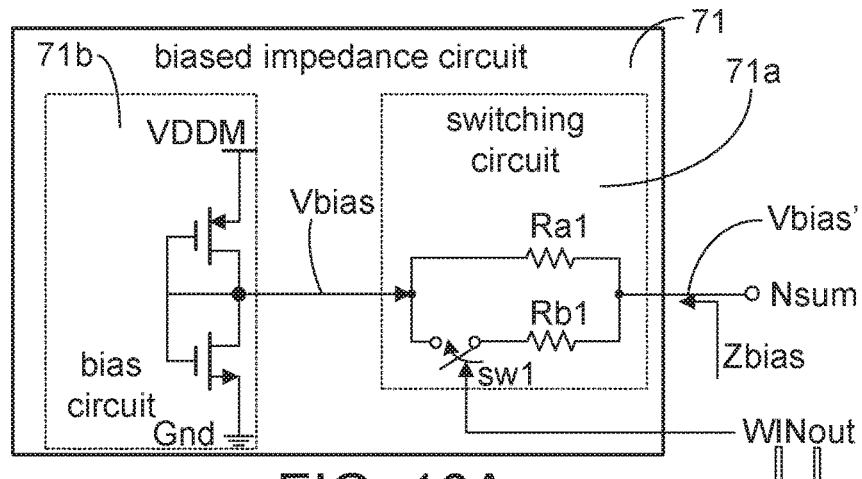
FIGS. 16A, 16B and 16C illustrate the biased impedance circuit including a bias circuit according to embodiments of the present disclosure.
Figure 16B:
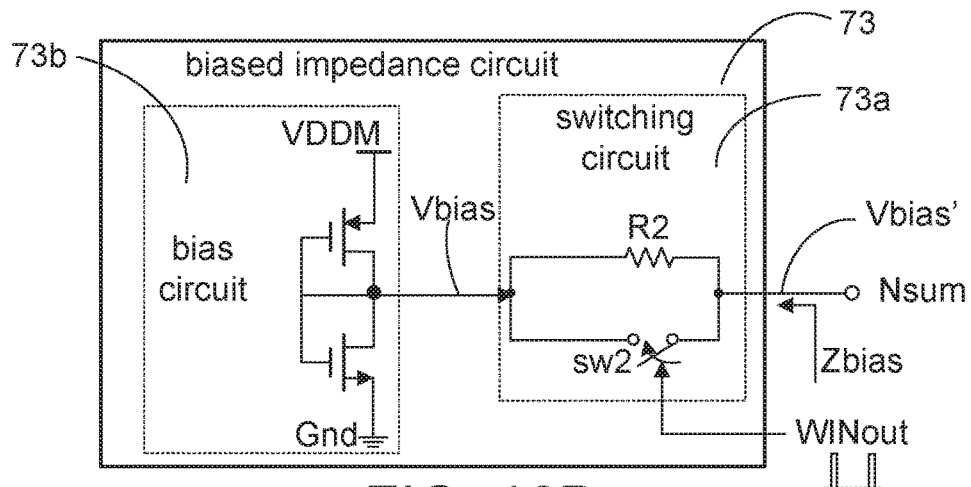
Figure 16C:
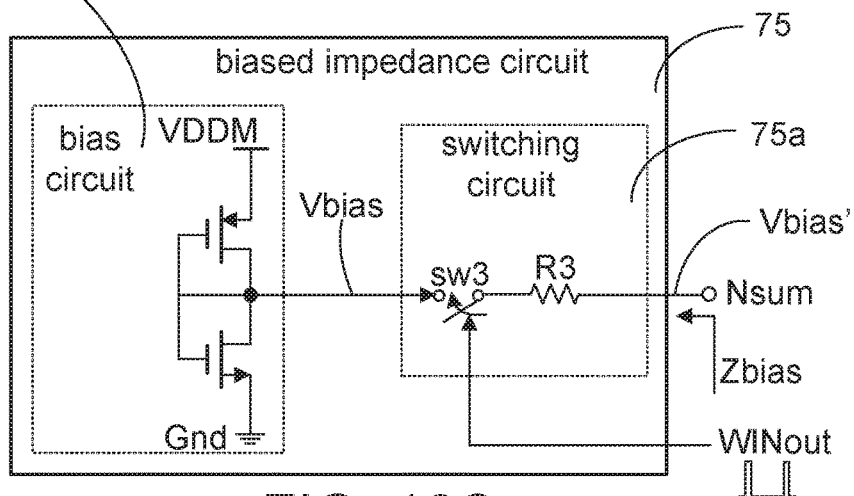
Figure 17:
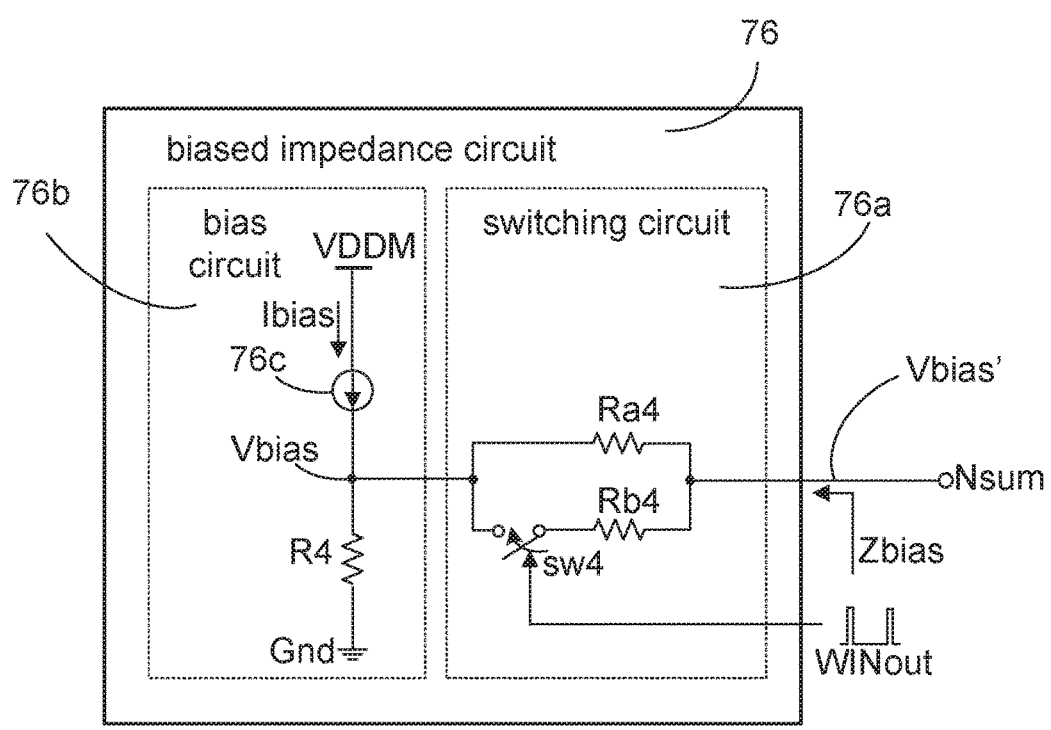
FIG. 17 illustrates the biased impedance circuit including a current source for providing the biasing voltage.
Figure 18A:
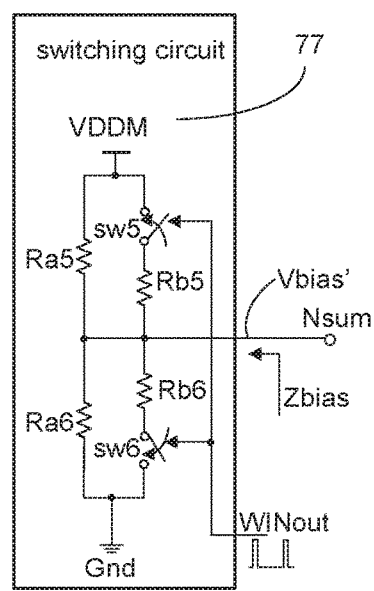
FIGS. 18A and 18B illustrate the biased impedance circuit excluding a bias circuit.
Figure 18B:
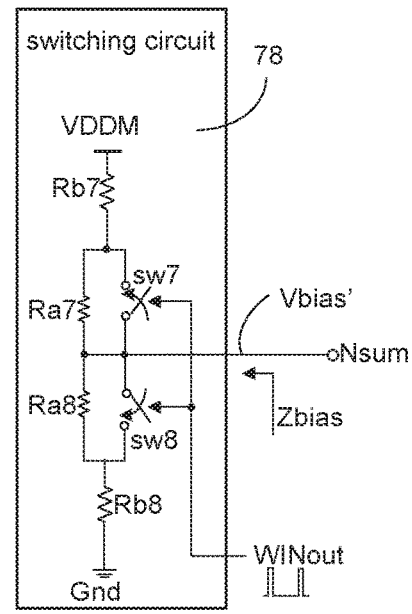
Figure 19:
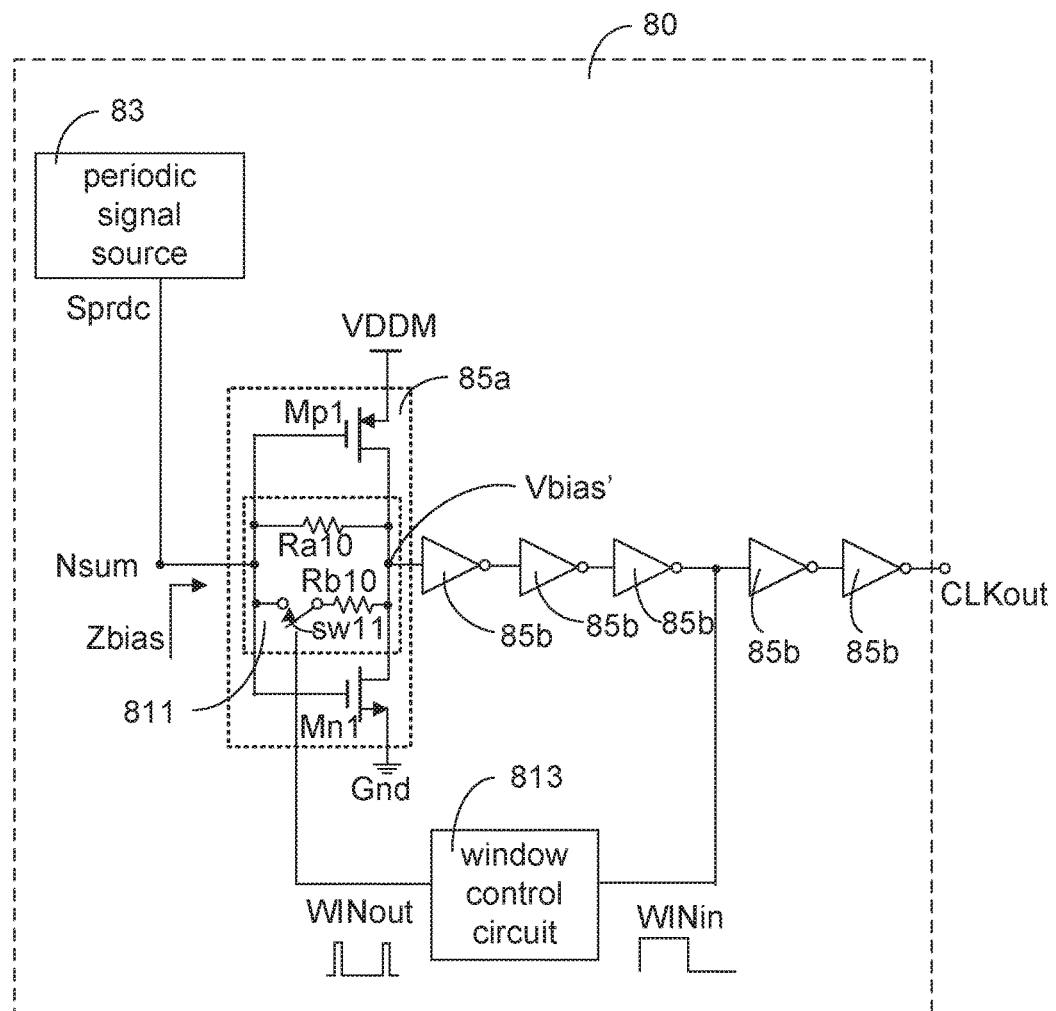
FIG. 19 illustrates the biased impedance circuit having the switching circuit being integrated into the squaring buffer.

According to embodiments of the present disclosure, implementation of the biased impedance circuit is not limited, and some types of the biased impedance circuit are illustrated below. FIGS. 16A~16C are the biased impedance circuits including a bias circuit, FIG. 17 is the biased impedance circuit including the bias circuit based on a current source, FIGS. 18A and 18B are the biased impedance circuits excluding the bias circuit, and FIG. 19 is the example that the biased impedance circuit is integrated into the first stage inverter of the squaring buffer. In these embodiments, the impedance is represented in a resistance manner for illustration purpose, but the impedance is not limited to resistance.

FIGS. 16A, 16B and 16C are diagrams illustrating the biased impedance circuit including a bias circuit according to embodiments of the present disclosure. All the biased impedance circuits 71, 73, 75 include a switching circuit 71a, 73a, 75a and a bias circuit 71b, 73b, 75b.

The bias circuits 71b, 73b, 75b in FIGS. 16A, 16B and 16C provide a biasing voltage Vbias to the switching circuits 71a, 73a, 75a. The biasing voltage Vbias is a direct current (hereinafter, DC) voltage and generated based on voltage of the voltage source VDDM. In addition, the switching circuits 71a, 73a, 75a receive the output window WINout and accordingly provide the adjusted biasing voltage Vbias'. In practical applications, the adjusted biasing voltage Vbias' can be variable. For example, the adjusted biasing voltage Vbias' can be equivalent to half of the voltage of the voltage source VDDM, that is, Vbias'=VDDM/2.

In FIG. 16A, the switching circuit 71a includes a switch sw1 and two resistors (Ra1 and Rb1). The resistor Ra1 has a high resistance (Rh) (for example 80 kΩ), and the resistor Rb1 has a low resistance (Rl) (for example 1 kΩ). Conducting status of the switch sw1 is controlled by the output window signal WINout.

When the output window signal WINout is at high voltage level, the switch (sw1) is turned on. Accordingly, the biased impedance Zbias to be applied to the summation node Nsum is jointly determined by the resistors Ra1, Rb1, that is, the biased impedance Zbias is equivalent to a parallel equivalent resistance of the resistors Ra and Rb. Since the resistance of the resistor Ra1 is greater than the resistance of the resistor Rb1, the resistor Rb1 dominates the biased impedance Zbias when the output window signal WINout is at high voltage level.

When the output window signal WINout is at low voltage level, the switch (sw1) is turned off. Accordingly, the biased impedance Zbias to be applied to the summation node Nsum is determined by the resistor Ra1.

Based on the above illustrations, the low impedance path (IMPl) of the switching circuit 71a includes the switch sw1 and the two resistors Ra, Rb, and the high impedance path (IMPh) includes only the resistor Ra1. As shown in FIG. 16A, the resistor Rb1 and the switch sw1 are used in both the low impedance path (IMPl) and the high impedance path (IMPh). Therefore, the high impedance path (IMPh) and the low impedance path (IMPl) may jointly use some components. That is, some components can be specifically used in one of the impedance paths, but some components can be used in both impedance paths.

In FIG. 16B, the switching circuit includes a switch sw2 and a resistor R2. Conducting status of the switch sw2 is controlled by the output window signal WINout. The resistance of the resistor R2 can be, for example, 80 kΩ.

When the output window signal WINout is at high voltage level, the switch sw2 is turned on. Accordingly, the biased impedance Zbias to be applied to the summation node Nsum is mainly determined by the conducted switch sw2, that is, the biased impedance Zbias is equivalent to a MOS switch on resistance (Ron) of the switch sw2. Therefore, the biased impedance Zbias is relatively low. When the output window signal WINout is at low voltage level, the switch sw2 is turned off. Accordingly, the biased impedance Zbias to be applied to the summation node Nsum is determined by the resistor R2. In this case, the biased impedance Zbias is relatively high. Therefore, the low impedance path (IMPl) of the switching circuit 73a includes the switch sw2 and the high impedance path (IMPh) includes the resistor R2.

In FIG. 16C, the switching circuit includes a switch sw3 and a resistor R3. Conducting status of the switch sw3 is controlled by the output window signal WINout. The resistance of the resistor R3 can be, for example, 1 kΩ.

When the output window signal WINout is at high voltage level, the switch sw3 is turned on. Accordingly, the biased impedance Zbias to be applied to the summation node Nsum is equivalent to the resistor R3. When the output window signal WINout is at low voltage level, the switch sw3 is turned off. Accordingly, the switching circuit 75a becomes an open circuit and the biased impedance Zbias to be applied to the summation node Nsum is equivalent to infinity. In this case, the biased impedance Zbias is relatively high. Based on the above illustrations, the low impedance path (IMPl) of the switching circuit 75a includes the switch sw3 and the resistor R3, and the high impedance path (IMPh) is equivalent to an open circuit.

FIG. 17 is a diagram illustrating the biased impedance circuit including a current source for providing the biasing voltage. The biased impedance circuit 76 includes a bias circuit 76b and a switching circuit 76a.

The bias circuit 76b includes a current source 76c and a resistor R4. The current source 76c provides a bias current Ibias flowing through the resistor R4 to the ground terminal Gnd. The biasing voltage Vbias can be obtained by the bias current Ibias and the resistor R4, that is, Vbias=Ibias*R4.

The switching circuit 76a includes a switch sw4 and two resistors Ra4, Rb4. The resistor Ra4 has a high resistance (Rh), and the resistor Rb4 has a low resistance (Rl). Conducting status of the switch sw4 is controlled by the output window signal WINout. Since the switching circuit 76a in FIG. 17 is similar to the switching circuit 71a in FIG. 16A, details about the switching circuit 76a are not redundantly illustrated.

FIGS. 18A and 18B are diagrams illustrating the biased impedance circuit excluding a bias circuit. In FIGS. 18A and 18B, the switching circuits 77, 78 are directly coupled to the voltage source VDDM and the ground terminal Gnd, and the switching circuits 77, 78 are capable of providing the adjusted biasing voltage Vbias' to the summation node Nsum. Both the switching circuits 77, 78 include two parts of components, an upper part and a lower part.

In FIG. 18A, the switching circuit includes two switches (sw5 and sw5) and four resistors (Ra5, Ra6, Rb5 and Rb6). The resistance of the resistors Ra5 and Ra6 are equivalent, and the resistance of the resistors Rb5 and Rb6 are equivalent. The resistors Ra5 and Ra6 have a high resistance (Rh), and the resistors Rb5 and Rb6 have a low resistance (Rl). Conducting statuses of the switches sw5, sw6 are controlled by the output window signal WINout.

In the upper part of the switching circuit 77, the resistor Ra5 is coupled to the VDDM and the summation node Nsum, and the switch sw5 and the resistor Rb5 are coupled in serial. The switch sw5 is coupled to the VDDM and the resistor Rb5 is coupled to the summation node Nsum. In the lower part of the switching circuit 77, the resistor Ra6 is coupled to the ground terminal and the summation node Nsum, and the switch sw6 and the resistor Rb6 are coupled in serial. The switch sw6 is coupled to the ground terminal Gnd and the resistor Rb6 is coupled to the summation node Nsum When the output window signal WINout is at high voltage level, the switches Rb5 and Rb6 are turned on. Accordingly, the impedance of the upper part of the switching circuit 77 is a parallel equivalent resistance of the resistors Ra5 and Rb5, and the impedance of the lower part of the switching circuit 77 is a parallel equivalent resistance of the resistors Ra6 and Rb6. Because the resistance of the resistor Rb5 is much less than that of the resistor Ra5, and the resistance of the resistor Rb6 is much less than that of the resistor Ra6, the resistors Rb5 and Rb6 having the low resistance (Rl) respectively dominate the resistance of the upper part and the low part of the switching circuit 77.

When the output window signal WINout is at low voltage level, the switches sw5 and sw6 are turned off. Accordingly, the impedance of the upper part of the switching circuit 77 is equivalent to the resistance of the resistor Ra5, and the impedance of the lower part of the switching circuit 77 is equivalent to the resistance of the resistor Ra5. In other words, when the output window signal WINout is at low voltage level, the resistors Ra5 and Ra6 having the high resistance (Rh) respectively dominate the resistance of the upper part and the low part of the switching circuit 77.

Based on the above illustrations, the biased impedance Zbias is determined by the resistors Ra5, Rb5, Ra6, Rb6 when the output window signal WINout is at high voltage level, and the biased impedance Zbias is determined by the resistors Ra5, Ra6 when the output window signal WINout is at low voltage level. Therefore, in FIG. 18A, the low impedance path (IMPl) includes the switches sw5, sw6 and the resistors Ra5, Ra6, Rb5, Rb6, and the high impedance path (IMPh) includes the resistors Ra5, Ra6.

In FIG. 18B, the switching circuit 78 includes two switches (sw1 and sw2) and four resistors (Ra1, Ra2, Rb1 and Rb2). The resistance of the resistors Ra7 and Ra8 are equivalent, and the resistance of the resistors Rb7 and Rb8 are equivalent. The resistors Ra7 and Ra8 have a high resistance (Rh), and the resistors Rb7 and Rb8 have a low resistance (Rl). Conducting statuses of the switches sw7, sw8 are controlled by the output window signal WINout.

In the upper part of the switching circuit 78, the resistor Ra7 and the switch sw7 are coupled to a terminal of the resistor Rb7 and the summation node Nsum. Another terminal of the resistor Rb7 is coupled to the VDDM. In the lower part of the switching circuit 78, the resistor Ra8 and the switch sw8 are both coupled to a terminal of the resistor Rb8 and the summation node Nsum. Another terminal of the resistor Rb8 is coupled to the ground terminal Gnd.

When the output window signal WINout is at high voltage level, the switches sw7 and sw8 are turned on. Meanwhile, a short circuit is formed between the resistor Rb7 and the summation node Nsum, and another short circuit is formed between the resistor Rb8 and the summation node Nsum. Accordingly, no current flows through the resistor Ra7 and Ra8 so that the impedance of the upper part of the switching circuit 78 is equivalent to the resistance of the resistor Rb7, and the impedance of the lower part of the switching circuit 78 is equivalent to the resistance of the resistor Rb8.

When the output window signal WINout is at low voltage level, the switches sw7 and sw8 are turned off. Accordingly, the impedance of the upper part of the switching circuit 78 is equivalent to summation of the resistance of the resistors Ra7 and Rb7; and the impedance of the lower part of the switching circuit 78 is equivalent to summation of the resistance of the resistors Ra8 and Rb8.

Based on the above illustrations, the biased impedance Zbias is determined by the resistors Rb7, Rb8 when the output window signal WINout is at high voltage level, and the biased impedance Zbias is determined by the resistors Ra7, Rb7, Ra8, Rb8 when the output window signal WINout is at low voltage level. Therefore, in FIG. 18B, the low impedance path (IMPl) includes the switches sw7, sw8 and the resistors Rb7, Rb8, and the high impedance path (IMPh) includes the resistors Ra7, Ra8, Rb7, Rb8.

FIG. 19 is a diagram illustrating the biased impedance circuit having the switching circuit being integrated into the squaring buffer. The signal generator 80 includes a periodic signal source 83, a squaring buffer including several inverters 85a, 85b, and an impedance adjustment circuit including a biased impedance circuit 811 and a window control circuit 813. The biased impedance circuit 811 and the first stage inverter 85a receive the periodic input signal Sprdc from the periodic signal source 83.

The window control circuit 813 receives the input window signal WINin from one of the inverters 85b. A final stage inverter among the plurality of inverters in the squaring buffer is coupled to an output of the signal generator, and the final stage inverter transmits the adjusted clock signal CLKout to the output of the signal generator.

The biased impedance circuit 811 includes a switch sw11 and two resistors Ra10 and Rb10. The resistor Ra10 has high resistance (Rh), and the resistor Rb10 has low resistance (Rl). The switch sw11 is controlled by the output window signal WINout. The switch sw11 and the resistor Rb10 are coupled in serial. The switch sw11 is coupled to the summation node Nsum, that is, the input of the first stage inverter 85a, and the resistor Rb10 is coupled to the output port of the first stage inverter 85a. The signal at the output port of the first stage inverter 85a can be defined as an adjusted biasing voltage Vbias'.

When the output window signal WINout is at high voltage level, the switch sw11 is turned on, and the impedance to be applied to the output port of the first stage inverter 85a is equivalent to a parallel equivalence of the resistors Ra10 and Rb10. When the output window signal WINout is at low voltage level, the switch sw11 is turned off, and the impedance to be applied to the output port of the first stage inverter 85a is equivalent to the resistance of the resistor Ra10.

Based on the above illustrations, the high impedance path (IMPh) includes the resistor Ra10, and the low impedance path (IMPl) includes switches sw11 and two resistors Ra10 and Rb10.

Figure 20:
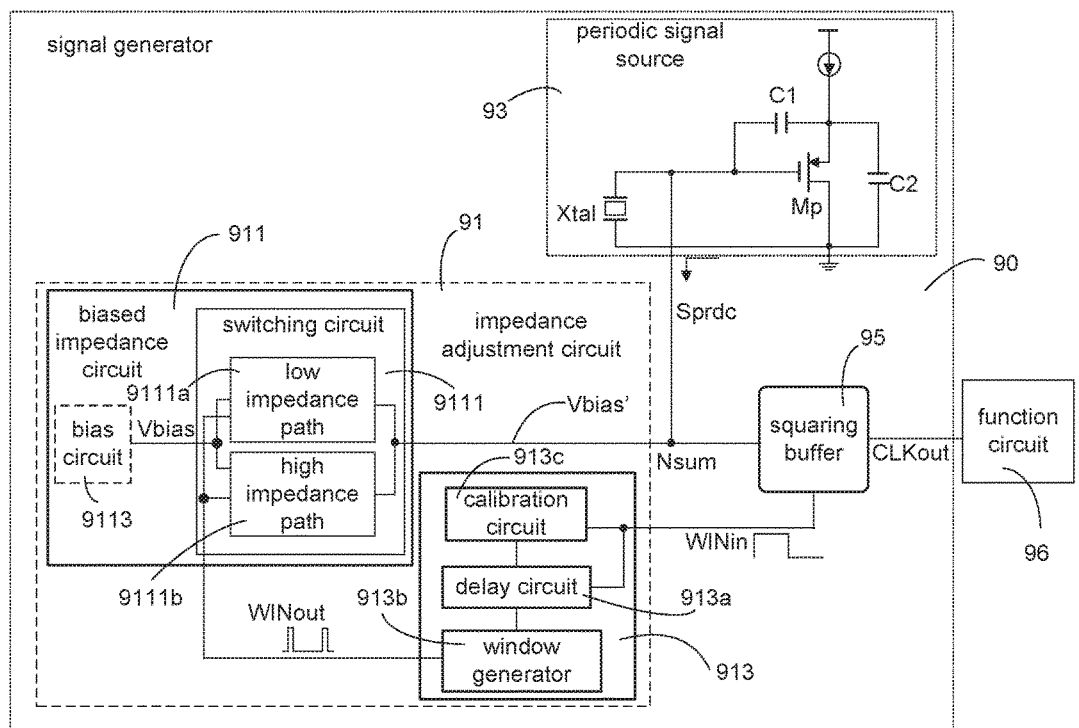
FIG. 20 illustrates application of the signal generator according to the embodiment of the present disclosure.

FIG. 20 is a diagram illustrating application of the signal generator according to the embodiment of the present disclosure. The signal generator 90 includes a periodic signal source 93, an impedance adjustment circuit 91 and a squaring buffer 95.

The periodic signal source 93, the impedance adjustment circuit 91, and the squaring buffer 95 are jointly coupled to the summation node Nsum. The impedance adjustment circuit 91 includes a window control circuit 913 and a biased impedance circuit 911.

The window control circuit 913 further includes a window generator 913b, a delay circuit 913a, and a calibration circuit 913c. The window control circuit 913 generates the output window signal WINout to determine which of the impedance paths will be selected by the switching circuit 9111.

The biased impedance circuit 911 includes a switching circuit 9111 which includes a low impedance path 9111a and a high impedance path 9111b. Depending on different design, the switching circuit 9111 may further include a bias circuit 9113 (as the embodiments shown FIGS. 16A-16C and 17).

When the periodic input signal Sprdc significantly transits, the signal generator 90 becomes very sensitive to the phase noise. In response to such sensitive characteristic during significant transitions of the signal generator 90, the window control circuit 913 outputs the output window signal WINout with high voltage level so that the biased impedance circuit 911 accordingly selects the low impedance path 9111a. In consequence, the switching circuit 9111 applies the low impedance to the summation node Nsum.

The output signal of the signal generator 90, that is, the adjusted clock signal CLKout, is provided to a function circuit 96, and the function circuit 96 can be, for example, a PLL circuit or an analog-to-digital converter (hereinafter, ADC).

The periodic signal source 93 in FIG. 20 is assumed to be a Colpitts oscillator that is preferred in low phase noise applications. The Colpitts oscillator includes capacitors C1, C2, a MOS transistor Mp, a current source and a crystal Xtal. Colpitts oscillators only need a single pin to connect with the crystal Xtal. The present disclosure is compatible with various periodic signal sources in practical application. For example, the periodic signal source can be a Pierce oscillator that needs two pins to couple the crystal.

According to above descriptions, embodiments of the biased impedance circuit, the impedance adjustment circuit, and the signal generator capable of dynamically selecting different impedance in accordance with the level of the output window signal WINout are illustrated. The voltage level of the output window signal WINout is determined according to transitions of the periodic input signal Sprdc. That is, duration when the output window signal WINout is at high voltage level is corresponding to significant transitions of the periodic input signal Sprdc.

When the output window signal WINout is at high voltage level, the periodic input signal Sprdc significantly transits and low impedance (Zl) is applied to the summation node Nsum. Meanwhile, the phase noise of the signal generator can be reduced because of low impedance (Zl).

When the output window signal WINout is at low voltage level, the periodic input signal Sprdc does not significantly transit and the high impedance (Zh) is applied to the summation node Nsum. Meanwhile, the amplitude loss can be reduced because the high impedance (Zh) is accompanied with high amplitude.

Alternatively speaking, the biased impedance Zbias having low impedance (Zbias=Zl) is applied to the summation node Nsum to reduce the phase noise while the signal generator is sensitive to the phase noise, and the biased impedance Zbias having high impedance (Zbias=Zh) is applied to the summation node Nsum to maintain the amplitude of the signal generator while the signal generator is less sensitive to the phase noise. In consequence, the tradeoff between the phase noise and the amplitude loss can be solved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A biased impedance circuit coupled to a summation node, wherein the biased impedance circuit applies a biased impedance to the summation node, a periodic input signal is received at the summation node, and the biased impedance circuit comprises:
   a switching circuit, for receiving an output window signal, wherein a period of the output window signal is shorter than a period of the periodic input signal, wherein the switching circuit comprises:
      a low impedance path, for setting the biased impedance to a first impedance when the output window signal is at a first voltage level, wherein a duration when the output window signal is at the first voltage level is corresponding to a significant transition of the periodic input signal; and
      a high impedance path, for setting the biased impedance to a second impedance when the output window signal is at a second voltage level, wherein the first impedance is less than the second impedance.

2. The biased impedance circuit according to claim 1, wherein the switching circuit conducts a direct current voltage to the summation node, and the periodic input signal and the direct current voltage are superimposed at the summation node.

3. The biased impedance circuit according to claim 2, further comprising:
   a bias circuit, coupled to a voltage source, a ground terminal and the switching circuit, wherein the bias circuit generates the direct current voltage.

4. The biased impedance setting circuit according to claim 2, wherein the switching circuit is coupled to a first voltage source and a second voltage source, wherein the direct current voltage is between the first voltage source and the second voltage source.

5. The biased impedance circuit according to claim 1, wherein the low impedance path comprises:
   at least one switch, wherein the biased impedance is changed in response to a conducting status of the at least one switch, and the conducting status is controlled by the output window signal.

6. An impedance adjustment circuit, coupled to a summation node, wherein a periodic input signal is received at the summation node, and the impedance adjustment circuit applies a biased impedance to the summation node, wherein the impedance adjustment circuit comprises:
   a window control circuit, for generating an output window signal according to at least one input window signal, wherein a period of the output window signal is shorter than a period of the periodic input signal, and a period of the at least one input window signal is shorter than or equivalent to the period of the periodic input signal; and
   a biased impedance circuit, coupled to the window control circuit and the summation node, wherein the biased impedance circuit comprises a switching circuit, wherein the switching circuit receives the output window signal from the window control circuit, and the switching circuit comprises:
      a low impedance path, for setting the biased impedance to a first impedance when the output window signal is at a first voltage level, wherein a duration when the output window signal is at the first voltage level is corresponding to a significant transition of the periodic input signal; and
      a high impedance path, for setting the biased impedance to a second impedance when the output window signal is at a second voltage level, wherein the first impedance is less than the second impedance.

7. The impedance adjustment circuit according to claim 6, wherein a duty cycle of the output window signal is less than or equivalent to 50%.

8. The impedance adjustment circuit according to claim 6, wherein the switching circuit conducts a direct current voltage to the summation node, and the periodic input signal and the direct current voltage are superimposed at the summation node.

9. The impedance adjustment circuit according to claim 6, wherein
   the window control circuit is coupled to a squaring buffer, and the squaring buffer generates the at least one input signal according to the periodic input signal; or
   the window control circuit is coupled to a reference clock circuit, and the reference clock circuit generates the at least one input window signal.

10. The impedance adjustment circuit according to claim 6, wherein
    the at least one input window signal and the periodic input signal are in phase, or
    the at least one input window signal and the periodic input signal are out of phase.

11. The impedance adjustment circuit according to claim 6, wherein the window control circuit comprises:
    a delay circuit, for generating a first delay signal and a second delay signal; and
    a window generator, coupled to the delay circuit, for generating the output window signal according to the first delay signal and the second delay signal.

12. The impedance adjustment circuit according to claim 11, wherein the delay circuit shifts the input window signal and accordingly generates a shift window signal, wherein the first delay signal and the second delay signal are generated based on the shift window signal, and a significant transition of the shift window signal is between a significant transition of the first delay signal and a significant transition of the second delay signal.

13. The impedance adjustment circuit according to claim 12, wherein the window control circuit further comprises:
a calibration circuit, coupled to the delay circuit, for generating a calibration signal in response to a time difference between the input window signal and the shift window signal.

14. The impedance adjustment circuit according to claim 6, wherein the low impedance path comprises:
at least one switch, wherein the biased impedance is changed in response to a conducting status of the at least one switch, and the conducting status is controlled by the output window signal.

15. A signal generator, comprising:
a periodic signal source, for transmitting a periodic input signal to a summation node;
an impedance adjustment circuit, coupled to the summation node, wherein the impedance adjustment circuit applies a biased impedance to the summation node, and the impedance adjustment circuit comprises:
  a window control circuit, for generating an output window signal according to at least one input window signal; and
  a biased impedance circuit, coupled to the window control circuit and the summation node, wherein the biased impedance circuit comprises a switching circuit, wherein the switching circuit receives the output window signal from the window control circuit, and the switching circuit comprises:
    a low impedance path, for setting the biased impedance to a first impedance when the output window signal is at a first voltage level, wherein a duration when the output window signal is at the first voltage level is corresponding to a significant transition of the periodic input signal; and
    a high impedance path, for setting the biased impedance to a second impedance when the output window signal is at a second voltage level, wherein the first impedance is less than the second impedance; and
a squaring buffer, coupled to the summation node, for generating an adjusted clock signal according to the periodic input signal and a direct current voltage, wherein a period of the output window signal is shorter than a period of the at least one input window signal and a period of the periodic input signal,
the period of the periodic input window signal and a period of the adjusted clock signal are equivalent, and
the period of the at least one input window signal is shorter than or equivalent to the period of the periodic input signal.

16. The signal generator according to claim 15, wherein the window control circuit comprises:
a delay circuit, for shifting the at least one input window signal and accordingly generating a first delay signal and a second delay signal; and
a window generator, coupled to the delay circuit, for generating the output window signal according to the first delay signal and the second delay signal.

17. The signal generator according to claim 15, wherein the periodic input signal is a sine-wave signal or a square-wave signal.

18. The signal generator according to claim 15, wherein
the input window signal and the periodic input signal are in phase; or
the input window signal and the periodic input signal are out of phase.

19. The signal generator according to claim 15, wherein
the window control circuit is coupled to the squaring buffer, and the squaring buffer generates the at least one input window signal according to the periodic input signal, or
the window control circuit is coupled to a reference clock circuit, and the reference clock circuit generates the at least one input window signal.

20. The signal generator according to claim 15, wherein the squaring comprises:
a plurality of inverters, coupled in serial, wherein
a first stage inverter among the plurality of inverters is coupled to the summation node, and
a final stage inverter among the plurality of inverters is coupled to an output of the signal generator, wherein
the first stage inverter receives the periodic input signal, and
the final stage inverter transmits the adjusted clock signal to the output of the signal generator.

* * * * *